United States Patent
Ishikura

(10) Patent No.: US 11,716,009 B2
(45) Date of Patent: Aug. 1, 2023

(54) THREE-LEVEL CONVERTER

(71) Applicant: Murata Manufacturing Co., Ltd., Nagaokakyo (JP)

(72) Inventor: Yuki Ishikura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 311 days.

(21) Appl. No.: 17/233,680

(22) Filed: Apr. 19, 2021

(65) Prior Publication Data

US 2021/0242768 A1   Aug. 5, 2021

Related U.S. Application Data

(63) Continuation of application No. PCT/JP2019/038700, filed on Oct. 1, 2019.

(30) Foreign Application Priority Data

Oct. 22, 2018  (JP) ................................. 2018-198279
Mar. 26, 2019  (JP) ................................. 2019-058922

(51) Int. Cl.
   *H02M 1/08*   (2006.01)
   *H02M 1/00*   (2006.01)
   (Continued)

(52) U.S. Cl.
   CPC ........... *H02M 1/08* (2013.01); *H02M 1/0006* (2021.05); *H02M 3/158* (2013.01); *H02M 7/4837* (2021.05); *H03K 17/687* (2013.01); *H03K 17/063* (2013.01); *H03K 17/102* (2013.01); *H03K 2217/0081* (2013.01)

(58) Field of Classification Search
   None
   See application file for complete search history.

(56) References Cited

U.S. PATENT DOCUMENTS 9,748,841 B2 *  8/2017  Granato .............. H02M 7/4837
11,588,391 B1 *  2/2023  Liu .......................... H02M 3/07
(Continued)

FOREIGN PATENT DOCUMENTS

| JP | 2009-017772 A | 1/2009 |
| JP | 2013-192383 A | 9/2013 |
| JP | 2014-033614 A | 2/2014 |

OTHER PUBLICATIONS

Official Communication issued in International Patent Application No. PCT/JP2019/038700, dated Dec. 17, 2019.

Primary Examiner — Matthew V Nguyen
(74) Attorney, Agent, or Firm — Keating & Bennett, LLP

(57) ABSTRACT

A three-level converter includes a switch circuit including first to fourth switch groups with n switches. A boot diode connected to a drive circuit to drive a switch on a lowest voltage side of a second switch group includes a cathode to which an anode of another boot diode of the second switch group is connected. A boot diode connected to a drive circuit to drive a switch element on a lowest voltage side of a third switch group includes a cathode to which an anode of another boot diode of the third switch group is connected. A boot diode connected to a drive circuit to drive a switch on a lowest voltage side of a fourth switch group includes a cathode to which an anode of another boot diode of the fourth switch group is connected.

20 Claims, 15 Drawing Sheets

(51) Int. Cl.
*H02M 7/483* (2007.01)
*H02M 3/158* (2006.01)
*H03K 17/687* (2006.01)
*H03K 17/06* (2006.01)
*H03K 17/10* (2006.01)

(56) References Cited

U.S. PATENT DOCUMENTS

| | | |
|---|---|---|
| 2018/0183330 A1 | 6/2018 | Assaad et al. |
| 2019/0058405 A1* | 2/2019 | Lazaro .................... H02M 3/06 |
| 2021/0050779 A1* | 2/2021 | Deng .................... H02M 3/073 |
| 2021/0194357 A1* | 6/2021 | Zhang .................... H02M 1/08 |
| 2022/0393578 A1* | 12/2022 | Ye .......................... H02M 7/483 |
| 2023/0073486 A1* | 3/2023 | Shen .................... H02M 3/003 |

* cited by examiner

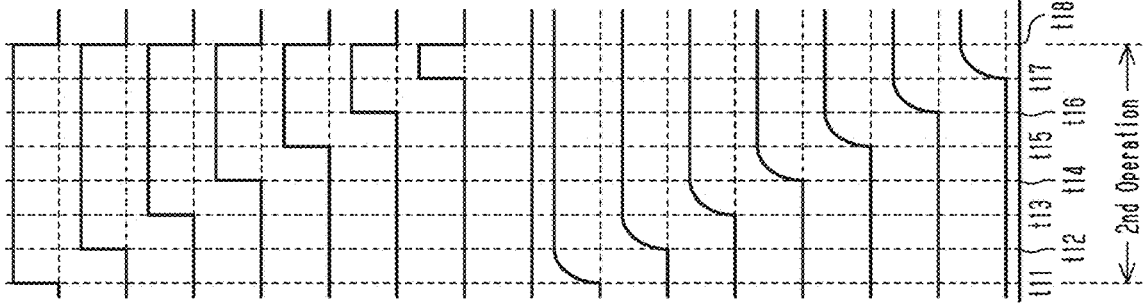
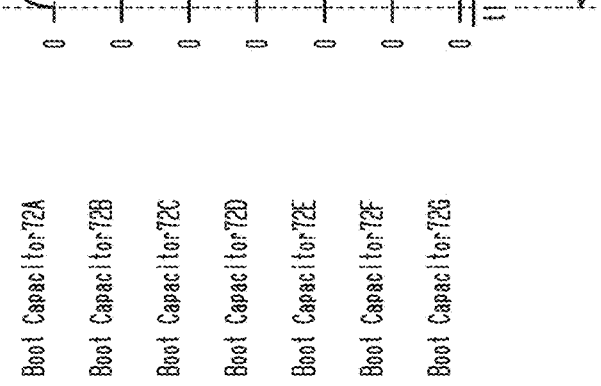
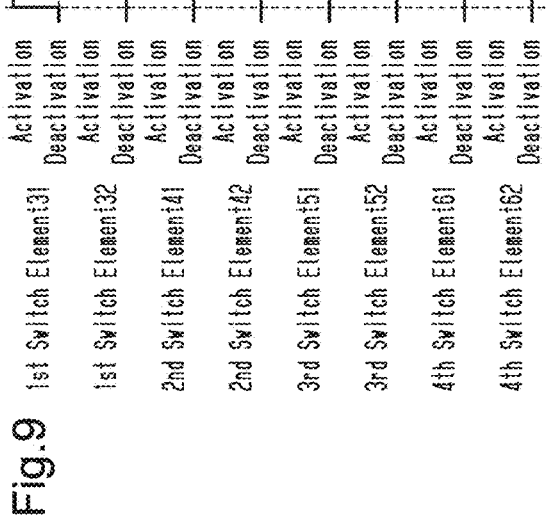
Fig.9  Fig.10

US 11,716,009 B2

THREE-LEVEL CONVERTER

CROSS REFERENCE TO RELATED APPLICATIONS

This application claims the benefit of priority to Japanese Patent Application No. 2018-198279 filed on Oct. 22, 2018 and Japanese Patent Application No. 2019-058922 filed on Mar. 26, 2019 and is a Continuation Application of PCT Application No. PCT/JP2019/038700 filed on Oct. 1, 2019. The entire contents of each application are hereby incorporated herein by reference.

BACKGROUND OF THE INVENTION

1. Field of the Invention

The present disclosure relates to a three-level converter.

2. Description of the Related Art

A typical multilevel converter using switches includes a power conversion circuit, drive circuits, and a power supply (refer to, for example, Japanese Laid-Open Patent Publication No. 2014-33614). The power conversion circuit includes (2m–2) switches including first to (2m–2)th switches and connected in series (m corresponds to the level of the power conversion circuit). The drive circuits are connected in correspondence with the switches. The power supply supplies power to the drive circuits.

Since a multilevel converter reduces a peak value of current flowing to an inductor, the multilevel converter is used for the purpose of reducing the size of the inductor or reducing noise. For example, first to fourth switch groups in which n switches (n is an integer that is greater than or equal to two) are connected in series may be used to obtain a three-level voltage. Japanese Laid-Open Patent Publication No. 2014-33614 discloses an example of a configuration including a bootstrap circuit. In this configuration, to obtain a three-level output with a switch circuit unit that includes switch groups of n switches, the switch located at a high potential side needs to be activated while the switch located at a low potential side is deactivated. However, when the low-potential-side switch is deactivated, power cannot be supplied to the bootstrap circuit from a common power supply, and the high-potential-side switch cannot be activated. As a result, the three-level output cannot be obtained.

SUMMARY OF THE INVENTION

Preferred embodiments of the present invention provide three-level converters that are each able to obtain a three-level output with a switch circuit that includes first to fourth switch groups including n switches.

A preferred embodiment of the present invention provides a three-level converter that includes first input/output portions to which a first voltage is applied, second input/output portions to which a second voltage that is lower than the first voltage is applied, a switch circuit including first to fourth switch groups, each of which includes n switches connected in series, where n is an integer that is greater than or equal to two, the first switch group, the second switch group, the third switch group, and the fourth switch group being connected in series between the first input/output portions sequentially from a low potential side of the first input/output portions, an inductor connected to a high potential side of the second input/output portions and connected in series with the first switch group and the second switch group between the second input/output portions, a controller to output a control signal that controls the switches, a flying capacitor connected between a first connection point located between the first switch group and the second switch group and a second connection point located between the third switch group and the fourth switch group, drive circuits respectively to activate and deactivate the switches in the switch groups based on the control signal, a power supply connected to one of the drive circuits to activate and deactivate one of the switches located at a side of the first input/output portions in the first switch group, the power supply to supply a voltage to the one of the drive circuits connected to the power supply; and bootstrap circuits respectively connected to the drive circuits excluding the one of the drive circuits connected to the power supply, each of the bootstrap circuits to supply a voltage to the connected one of the drive circuits based on a voltage of the power supply. A cathode of a boot diode in one of the bootstrap circuits that is connected to one of the drive circuits to drive one of the switches located at the lowest potential side in the second switch group, is connected to an anode of a boot diode in another one of the bootstrap circuits in the second switch group. A cathode of a boot diode in one of the bootstrap circuits that is connected to one of the drive circuits to drive one of the switches located at the lowest potential side in the third switch group, is connected to an anode of a boot diode in another one of the bootstrap circuits in the third switch group. A cathode of a boot diode in one of the bootstrap circuits that is connected to one of the drive circuits to drive one of the switches located at the lowest potential side in the fourth switch group, is connected to an anode of a boot diode in another one of the bootstrap circuits in the fourth switch group. The controller executes a first operation that complementarily drives the switches in the first switch group and the switches in the fourth switch group and complementarily drives the switches in the second switch group and the switches in the third switch group.

With this configuration, the anode of the boot diode in the high-potential-side bootstrap circuit is connected to the cathode of the boot diode in the low-potential-side bootstrap circuit. When complementarily driving the switches, power is supplied to the bootstrap circuits (boot capacitors) even if the low-potential side switch is deactivated and the supply of power for driving the high-potential side switch is stopped. Thus, a three-level output is obtained with the switch circuit including the first to fourth switch groups including n switches.

A preferred embodiment of the present provides a three-level converter that includes first input/output portions to which a first voltage is applied, second input/output portions to which a second voltage that is lower than the first voltage is applied, a switch circuit including first to fourth switch groups, each of which includes n switches connected in series, where n is an integer that is greater than or equal to two, the first switch group, the second switch group, the third switch group, and the fourth switch group being connected in series between the first input/output portions sequentially from a low potential side of the first input/output portions, an inductor connected to a high potential side of the second input/output portions and connected in series with the first switch group and the second switch group between the second input/output portions, a controller to output a control signal that controls the switches, a flying capacitor connected between a first connection point located between the first switch group and the second switch group and a second connection point located between the third switch group and the fourth switch group, first drive circuits to activate and deactivate the switches in the first switch group and the second switch group based on the control signal, second drive circuits to activate and deactivate the switches in the third switch group and the fourth switch group based on the control signal, a first power supply connected to one of the first drive circuits to activate and deactivate one of the switches located at a side of the first input/output portions in the first switch group, the first power supply to supply a voltage to the one of the first drive circuits connected to the first power supply, first bootstrap circuits respectively connected to the first drive circuits excluding the one of the first drive circuits connected to the first power supply, each of the first bootstrap circuits to supply a voltage to the connected one of the first drive circuits based on a voltage of the first power supply, a second power supply connected to one of the second drive circuits to activate and deactivate one of the switches located at a side of the first input/output portions in the third switch group, the second power supply to supply a voltage to the one of the second drive circuits connected to the second power supply, and second bootstrap circuits respectively connected to the second drive circuits excluding the one of the second drive circuits connected to the second power supply, each of the second bootstrap circuits to supply a voltage to the connected one of the second drive circuits based on a voltage of the second power supply. A cathode of a boot diode in one of the first bootstrap circuits, to drive one of the switches located at the lowest potential side in the second switch group, is connected to an anode of a boot diode in another one of the first bootstrap circuits in the second switch group. A cathode of a boot diode in one of the second bootstrap circuits, to drive one of the switches located at the lowest potential side in the fourth switch group, is connected to an anode of a boot diode in another one of the second bootstrap circuits in the fourth switch group. The controller executes a first operation that complementarily drives the switches in the first switch group and the switches in the fourth switch group and complementarily drives the switches in the second switch group and the switches in the third switch group.

With this configuration, the anode of the boot diode in the high-potential-side bootstrap circuit is connected to the cathode of the boot diode in the low-potential-side bootstrap circuit. When complementarily driving the switches, power is supplied to the bootstrap circuits (boot capacitors) even if the supply of power from each power supply is stopped. Thus, a three-level output is obtained with the switch circuit including the first to fourth switch groups including n switches.

The three-level converters according to preferred embodiments of the present invention are each configured to obtain a three-level output with a switch circuit that includes first to fourth switch groups including n switches.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a time chart showing an example of an operation of a switching circuit in a modified example of a preferred embodiment of the present invention.

FIG. 10 is a time chart showing an example of an operation of a switching circuit in a modified example of a preferred embodiment of the present invention.

DETAILED DESCRIPTION OF THE PREFERRED EMBODIMENTS

Figure 1:
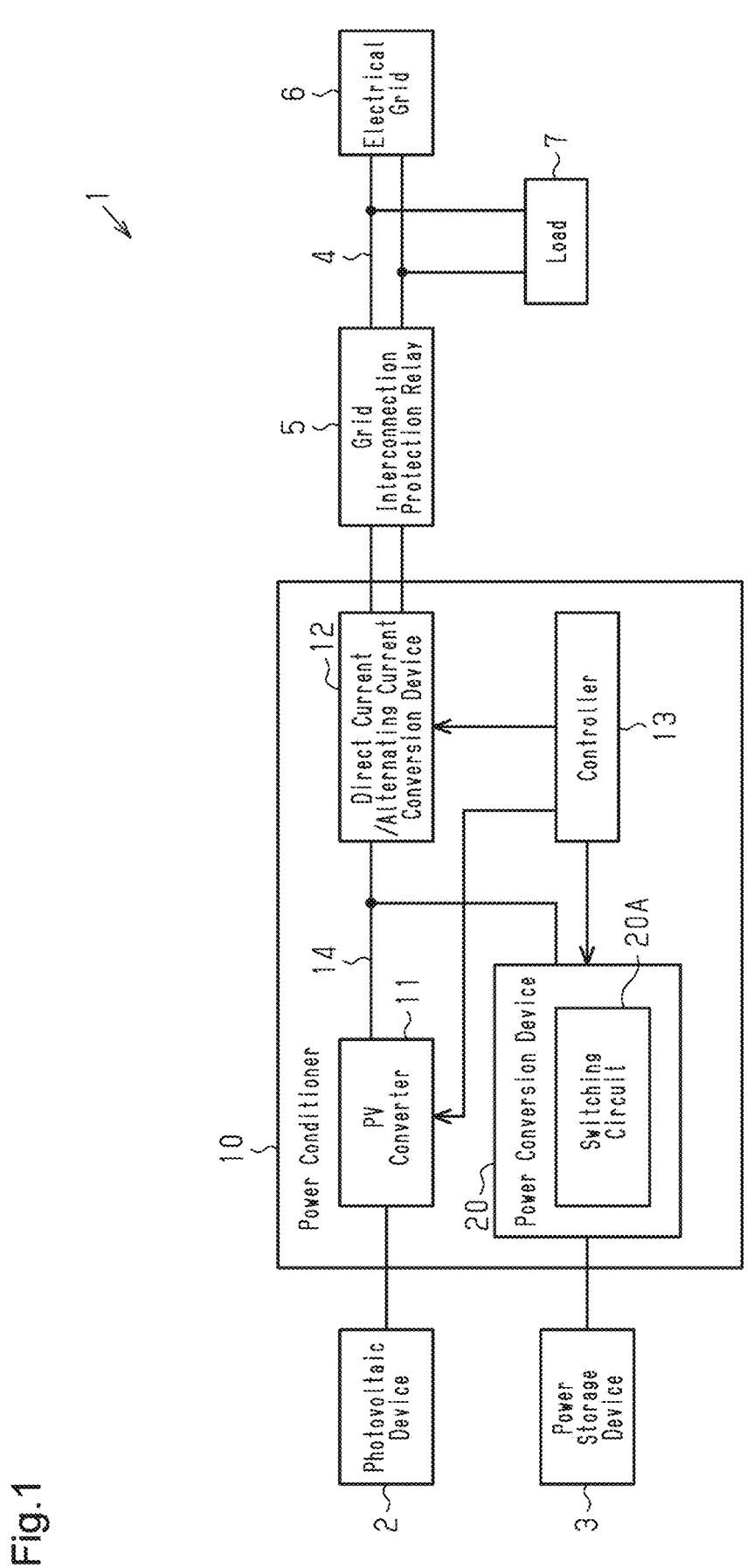
FIG. 1 is a configuration diagram of a power managing system that includes a switching circuit according to a first preferred embodiment of the present invention.

Preferred embodiments will be described below with reference to the accompanying drawings.

Components in the drawings may be enlarged for simplicity and clarity. The dimensional proportions of components may not be drawn to scale or may differ between drawings.

First Preferred Embodiment

As shown in FIG. 1, a power managing system 1 includes a power conditioner 10, a photovoltaic device 2, and a power storage device 3. The photovoltaic device 2 and the power storage device 3 are electrically connected to the power conditioner 10. The power conditioner 10 is connected to an electrical grid 6 by an alternating current bus line 4 and a grid interconnection protection relay 5. As viewed from the power conditioner 10, a load 7 is connected to the alternating current bus line 4 at an outer side of the grid interconnection protection relay 5 by a distribution board or the like, which is not illustrated. The grid interconnection protection relay 5 is configured to disconnect the power conditioner 10 from the electrical grid 6. The load 7 is, for example, an indoor load and includes, for example, lighting, a refrigerator, a laundry machine, an air conditioning device, and a microwave oven. The power managing system 1 uses the power conditioner 10 to adjust power among the photovoltaic device 2, the power storage device 3, the electrical grid 6, and the load 7. An example of the adjustment includes adjustment of power generated by the photovoltaic device 2 when the power is fed back to the electrical grid 6, stored in the power storage device 3, or supplied to the load 7, and adjustment of power of the electrical grid 6 when the power is stored in the power storage device 3 or supplied to the load 7. In addition to a photovoltaic device, for example, a wind power generator, a gas power generator, or a geothermal power generator may be used as a power generator.

The photovoltaic device 2 includes a photovoltaic panel (not shown) and supplies direct current power generated by the photovoltaic panel to the power conditioner 10. The photovoltaic device 2 executes, for example, maximum power point tracking (MPPT), which extracts a current at an output voltage maximizing power that is output from the photovoltaic panel.

The power storage device 3 includes storage cells connected in series. The power conditioner 10 controls the charging and discharging of the power storage device 3.

The power conditioner 10 includes a photovoltaic (PV) converter 11, a direct current/alternating current conversion device 12 (DC/AC converter), a controller 13 of a third-level converter, and a power conversion device 20 of a three-level converter. The PV converter 11, the direct current/alternating current conversion device 12, and the power conversion device 20 are connected to a high-voltage direct current bus 14. That is, the PV converter 11, the direct current/alternating current conversion device 12, and the power conversion device 20 are connected to each other by the high-voltage direct current bus 14.

The photovoltaic device 2 is connected to the PV converter 11. Direct current power of the photovoltaic device 2 varies depending on insolation conditions such as season, weather, and hour, for example. The PV converter 11 converts the direct current power of the photovoltaic device 2 into a direct current power of a set voltage and outputs the direct current power to the high-voltage direct current bus 14 under the maximum power point tracking control. An example of the set voltage that is output from the PV converter 11 to the high-voltage direct current bus 14 is about 380 V. The direct current/alternating current conversion device 12 is connected to the alternating current bus line 4. The direct current/alternating current conversion device converts a direct current power of the high-voltage direct current bus 14 into an alternating current power of about 200 V, for example, as an effective value and outputs the alternating current power to the alternating current bus line 4. The direct current/alternating current conversion device 12 also converts an alternating current power of the alternating current bus line 4 into a direct current power of the set voltage and outputs the direct current power to the high-voltage direct current bus 14.

The power conversion device 20 converts the direct current power of the high-voltage direct current bus 14 into a direct current power that charges the power storage device 3. The power conversion device 20 also converts a direct current power discharged from the power storage device 3 into a direct current power of the set voltage corresponding to the high-voltage direct current bus 14. In the present preferred embodiment, the power conversion device 20 is preferably, for example, a bidirectional DC/DC converter that generates a three-level voltage.

The controller 13 is connected to perform communication with the PV converter 11, the direct current/alternating current conversion device 12, and the power conversion device 20 and controls operation of each of the PV converter 11, the direct current/alternating current conversion device 12, and the power conversion device 20. The controller 13 includes an arithmetic processor that executes a predetermined control program. The arithmetic processor preferably includes, for example, a central processing unit (CPU) or a micro processing unit (MPU). The controller 13 may include one or more microcomputers, for example. The controller 13 may include multiple arithmetic processors located at separate locations. The controller 13 further includes storage. The storage stores various control programs and information used for various control processes. The storage includes, for example, nonvolatile memory and volatile memory. The control program may be stored in a non-transitory computer readable medium.

Figure 2:
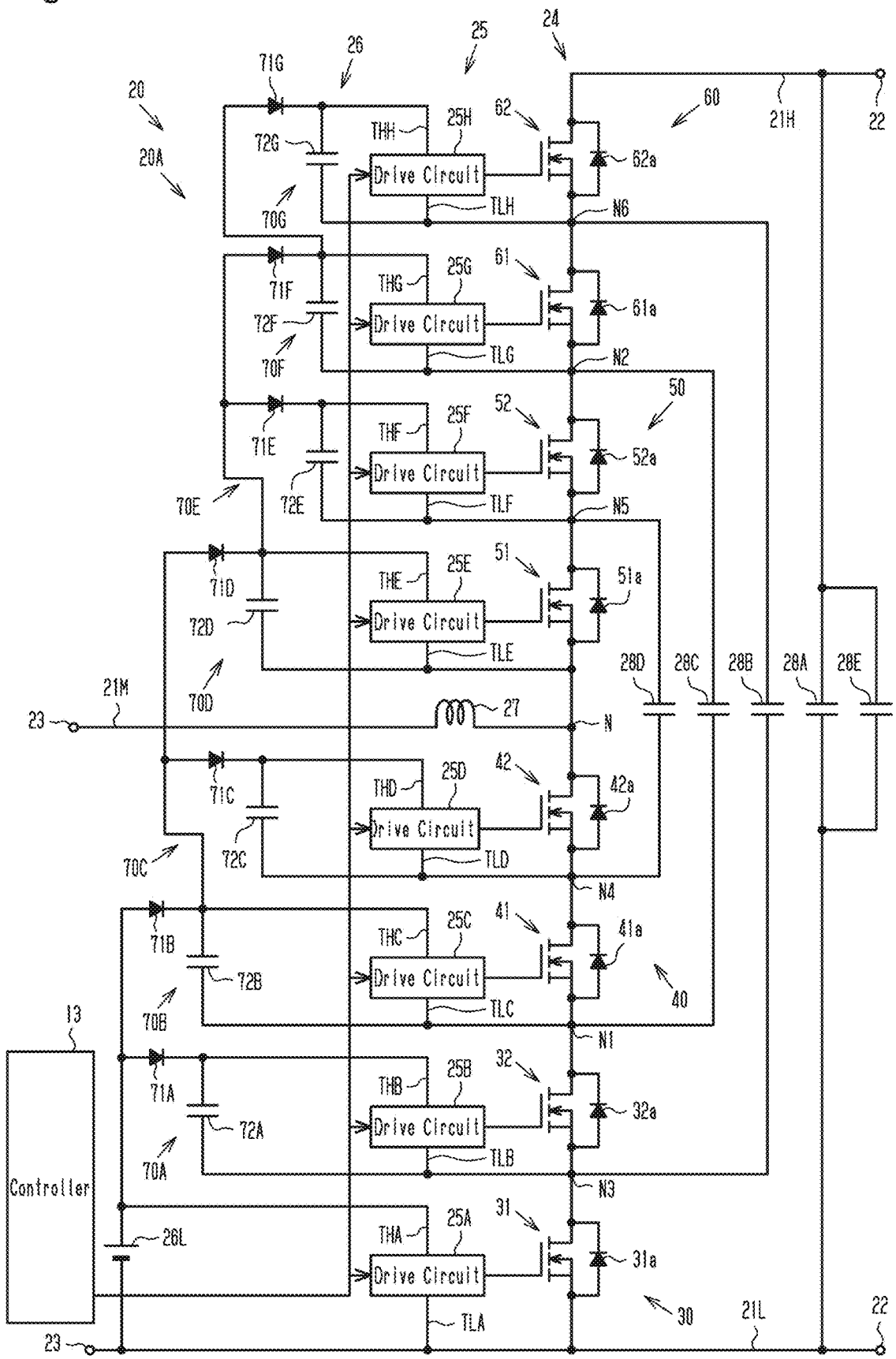
FIG. 2 is a circuit diagram showing the switching circuit of the first preferred embodiment of the present invention.

As shown in FIG. 2, the power conversion device 20 includes a switching circuit 20A. The switching circuit 20A includes first input/output portions 22 and second input/output portions 23. The first input/output portions 22 include two first input/output terminals connected to the high-voltage direct current bus 14, which is shown in FIG. 1. The second input/output portions 23 include two second input/output terminals connected to the power storage device 3 shown in FIG. 1.

The switching circuit 20A includes a first wire 21L, a second wire 21H, and a third wire 21M. The low potential side of the first input/output portions 22 and the low potential side of the second input/output portions 23 are connected to the first wire 21L and are, for example, connected to a ground potential. The second input/output portions 23 are connected to the power storage device 3 shown in FIG. 1. The switching circuit 20A is connected to the high-voltage direct current bus 14 shown in FIG. 1 via the first input/output portions 22. The voltage applied to opposite ends of the second input/output portions 23 is a terminal voltage of the power storage device 3 (e.g., about 200 V). The voltage value is less than the voltage applied to opposite ends of the first input/output portions 22, that is, a voltage of the high-voltage direct current bus 14 (e.g., about 380 V).

The power conversion device 20 includes a switch circuit 24 in which first to fourth switch groups 30, 40, 50, and 60 are connected in series between the first wire 21L and the second wire 21H, drive circuits 25 (drivers) that drive the switch circuit unit 24, and a power supply circuit 26 that supplies an operating voltage to the drive circuits 25. The controller 13 outputs a control signal to the drive circuits 25 to control activation and deactivation of the first to fourth switch groups 30, 40, 50, and 60 of the switch circuit unit 24.

The first to fourth switch groups 30, 40, 50, and 60 are connected in series and the first switch group 30, the second switch group 40, the third switch group 50, and the fourth switch group 60 are sequentially arranged from the side of the first wire 21L, which is the low-potential side. A connection node N between the second switch group 40 and the third switch group 50 is connected to the third wire 21M. The third wire 21M is connected to a high-voltage-side terminal of the second input/output portions 23 by an inductor 27. The first wire 21L is connected to a low-voltage-side terminal of the second input/output portions 23.

The first switch group 30 includes n first switches 31 and 32 that are connected in series between the second switch group 40 and the first wire 21L (n is an integer that is greater than or equal to two, and in the present preferred embodiment, n is two, for example). Each of the first switches 31 and 32 is preferably, for example, an N-type metal-oxide-semiconductor field-effect transistor (MOSFET). In the present preferred embodiment, the first switches 31 and 32 are MOSFETs including a silicon (Si) substrate. The first switches 31 and 32 include body diodes 31a and 32a, respectively. The first switches 31 and 32 are arranged in the order from the first switch element 31 to the first switch element 32 from the low-potential side toward the high-potential side. The source of the first switch element 31 is connected to the first wire 21L. The drain of the first switch element 31 is connected to the source of the first switch element 32. The drain of the first switch element 32 is connected to a connection node N1 between the first switch group 30 and the second switch group 40.

The second switch group 40 includes n second switches 41 and 42 that are connected in series between the first switch group 30 and the connection node N (n is an integer that is greater than or equal to two, and in the present preferred embodiment, n is two, for example). Each of the second switches 41 and 42 is preferably, for example, an N-type MOSFET. In the present preferred embodiment, the second switches 41 and 42 are MOSFETs including a silicon (Si) substrate. The second switches 41 and 42 include body diodes 41a and 42a, respectively. The second switches 41 and 42 are arranged in the order from the second switch element 41 to the second switch element 42 from the low-potential side toward the high-potential side. The source of the second switch element 41 is connected to the connection node N1 between the first switch group 30 and the second switch group 40. The drain of the second switch element 41 is connected to the source of the second switch element 42. The drain of the second switch element 42 is connected to the connection node N between the second switch group 40 and the third switch group 50.

The third switch group 50 includes n third switches 51 and 52 that are connected in series between the connection node N and the fourth switch group 60 (n is an integer that is greater than or equal to two, and in the present preferred embodiment, n is two, for example). Each of the third switches 51 and 52 is preferably, for example, an N-type MOSFET. In the present preferred embodiment, the third switches 51 and 52 are MOSFETs including a silicon (Si) substrate. The third switches 51 and 52 include body diodes 51a and 52a, respectively. The third switches 51 and 52 are arranged in the order from the third switch element 51 to the third switch element 52 from the low-potential side toward the high-potential side. The source of the third switch element 51 is connected to the connection node N. The drain of the third switch element 51 is connected to the source of the third switch element 52. The drain of the third switch element 52 is connected to a connection node N2 between the third switch group 50 and the fourth switch group 60.

The fourth switch group 60 includes n fourth switches 61 and 62 that are connected in series between the third switch group 50 and the second wire 21H (n is an integer that is greater than or equal to two, and in the present preferred embodiment, n is two, for example). Each of the fourth switches 61 and 62 is preferably, for example, an N-type MOSFET. In the present preferred embodiment, the fourth switches 61 and 62 are MOSFETs including a silicon (Si) substrate. The fourth switches 61 and 62 include body diodes 61a and 62a, respectively. The fourth switches 61 and 62 are arranged in the order from the fourth switch element 61 to the fourth switch element 62 from the low-potential side toward the high-potential side. The source of the fourth switch element 61 is connected to the connection node N2 between the third switch group 50 and the fourth switch group 60. The drain of the fourth switch element 61 is connected to the source of the fourth switch element 62. The drain of the fourth switch element 62 is connected to the second wire 21H.

The drive circuits 25 include drive circuits 25A to 25H (in the present preferred embodiment, eight drive circuits, for example) that respectively drive the switches 31, 32, 41, 42, 51, 52, 61, and 62 of the first to fourth switch groups 30, 40, 50, and 60.

The drive circuits 25A to 25H are connected to the controller 13. The controller 13 outputs a control signal to each of the drive circuits 25A to 25H. The drive circuits 25A to 25H, for example, include a push-pull circuit and are configured so that the push-pull circuit operates based on a control signal.

The drive circuits 25A to 25H include high-potential power supply terminals THA to THH and low-potential power supply terminals TLA to TLH. The low-potential power supply terminal TLA of the drive circuit 25A is connected to the first wire 21L. The low-potential power supply terminal TLB of the drive circuit 25B is connected to a connection node N3 between the first switch element 31 and the first switch element 32. The low-potential power supply terminal TLC of the drive circuit 25C is connected to the connection node N1 between the first switch group 30 and the second switch group 40. The low-potential power supply terminal TLD of the drive circuit 25D is connected to a connection node N4 between the second switch element 41 and the second switch element 42. The low-potential power supply terminal TLE of the drive circuit 25E is connected to the connection node N. The low-potential power supply terminal TLF of the drive circuit 25F is connected to a connection node N5 between the third switch element 51 and the third switch element 52. The low-potential power supply terminal TLG of the drive circuit 25G is connected to the connection node N2 between the third switch group 50 and the fourth switch group 60. The low-potential power supply terminal TLH of the drive circuit 25H is connected to a connection node N6 between the fourth switch element 61 and the fourth switch element 62.

The drive circuit 25A is connected to the gate of the first switch element 31 and activates and deactivates the first switch element 31 based on a control signal from the controller 13. The drive circuit 25B is connected to the gate of the first switch element 32 and activates and deactivates the first switch element 32 based on a control signal from the controller 13.

The drive circuit 25C is connected to the gate of the second switch element 41 and activates and deactivates the second switch element 41 based on a control signal from the controller 13. The drive circuit 25D is connected to the gate of the second switch element 42 and activates and deactivates the second switch element 42 based on a control signal from the controller 13.

The drive circuit 25E is connected to the gate of the third switch element 51 and activates and deactivates the third switch element 51 based on a control signal from the controller 13. The drive circuit 25F is connected to the gate of the third switch element 52 and activates and deactivates the third switch element 52 based on a control signal from the controller 13.

The drive circuit 25G is connected to the gate of the fourth switch element 61 and activates and deactivates the fourth switch element 61 based on a control signal from the controller 13. The drive circuit 25H is connected to the gate of the fourth switch element 62 and activates and deactivates the fourth switch element 62 based on a control signal from the controller 13.

The power supply circuit 26 includes a power supply 26L that supplies power to the drive circuit 25A, which is located at the low potential side. The power supply circuit 26 further includes bootstrap circuits 70A to 70G that supply power (voltage) to the drive circuits 25B to 25H based on power (voltage) of the power supply 26L.

The power supply 26L is preferably, for example, a direct current power supply. The power supply 26L is connected to the drive circuit 25A, which is located closest to the first wire 21L among the drive circuits 25A to 25H. More specifically, a negative terminal of the power supply 26L is connected to the first wire 21L, and a positive terminal of the power supply 26L is connected to the high-potential power supply terminal THA of the drive circuit 25A.

The bootstrap circuit 70A is connected between the drive circuit 25B and the positive terminal of the power supply 26L. The bootstrap circuit 70B is connected between the drive circuit 25C and the positive terminal of the power supply 26L. That is, the positive terminal of the power supply 26L is connected to the high-potential power supply terminals THB and THC of the drive circuits 25B and 25C by the bootstrap circuits 70A and 70B. The bootstrap circuits 70A and 70B include boot diodes 71A and 71B and boot capacitors 72A and 72B.

The anode of the boot diode 71A of the bootstrap circuit 70A is connected to the positive terminal of the power supply 26L. The cathode of the boot diode 71A is connected to the high-potential power supply terminal THB of the drive circuit 25B. The boot capacitor 72A of the bootstrap circuit 70A includes a first terminal connected to the cathode of the boot diode 71A and the high-potential power supply terminal THB of the drive circuit 25B. The boot capacitor 72A includes a second terminal connected to the low-potential power supply terminal TLB of the drive circuit 25B. The bootstrap circuit 70A supplies a voltage to activate the first switch element 32 (drive voltage) to the drive circuit 25B.

The anode of the boot diode 71B of the bootstrap circuit 70B is connected to the positive terminal of the power supply 26L. The cathode of the boot diode 71B is connected to the high-potential power supply terminal THC of the drive circuit 25C. The boot capacitor 72B of the bootstrap circuit 70B includes a first terminal connected to the cathode of the boot diode 71B and the high-potential power supply terminal THC of the drive circuit 25C. The boot capacitor 72B includes a second terminal connected to the low-potential power supply terminal TLC of the drive circuit 25C. The bootstrap circuit 70B supplies a voltage to activate the second switch element 41 (drive voltage) to the drive circuit 25C.

The bootstrap circuit 70C is connected between the bootstrap circuit 70B and the drive circuit 25D. The bootstrap circuit 70D is connected between the bootstrap circuit 70B and the drive circuit 25E. The bootstrap circuits 70C and 70D include boot diodes 71C and 71D and boot capacitors 72C and 72D.

The anode of the boot diode 71C of the bootstrap circuit 70C is connected to the cathode of the boot diode 71B. The cathode of the boot diode 71C is connected to the high-potential power supply terminal THD of the drive circuit 25D. The boot capacitor 72C of the bootstrap circuit 70C includes a first terminal connected to the high-potential power supply terminal THD of the drive circuit 25D and the cathode of the boot diode 71C. The boot capacitor 72C includes a second terminator connected to the low-potential power supply terminal TLD of the drive circuit 25D. The bootstrap circuit 70C supplies a voltage to activate the second switch element 42 (drive voltage) to the drive circuit 25D.

The anode of the boot diode 71D of the bootstrap circuit 70D is connected to the cathode of the boot diode 71B. The cathode of the boot diode 71D is connected to the high-potential power supply terminal THE of the drive circuit 25E. The boot capacitor 72D of the bootstrap circuit 70D includes a first terminal connected to the cathode of the boot diode 71D and the high-potential power supply terminal THD of the drive circuit 25E. The boot capacitor 72D includes a second terminal connected to the low-potential power supply terminal TLE of the drive circuit 25E. The bootstrap circuit 70D supplies a voltage to activate the third switch element 51 (drive voltage) to the drive circuit 25E.

The bootstrap circuit 70E is connected between the bootstrap circuit 70D and the drive circuit 25F. The bootstrap circuit 70F is connected between the bootstrap circuit 70D and the drive circuit 25G. The bootstrap circuits 70E and 70F include boot diodes 71E and 71F and boot capacitors 72E and 72F.

The anode of the boot diode 71E of the bootstrap circuit 70E is connected to the cathode of the boot diode 71D. The cathode of the boot diode 71E is connected to the high-potential power supply terminal THF of the drive circuit 25F. The boot capacitor 72E of the bootstrap circuit 70E includes a first terminal connected to the cathode of the boot diode 71E and the high-potential power supply terminal THF of the drive circuit 25F. The second terminal of the boot capacitor 72E is connected to the low-potential power supply terminal TLD of the drive circuit 25D. The bootstrap circuit 70E supplies a voltage to activate the third switch element 52 (drive voltage) to the drive circuit 25F.

The anode of the boot diode 71F of the bootstrap circuit 70F is connected to the cathode of the boot diode 71D. The cathode of the boot diode 71E is connected to the high-potential power supply terminal THF of the drive circuit 25G. The boot capacitor 72F of the bootstrap circuit 70F includes a first terminal connected to the cathode of the boot diode 71F and the high-potential power supply terminal THG of the drive circuit 25G. The boot capacitor 72F includes a second terminal connected to the low-potential power supply terminal TLG of the drive circuit 25G. The bootstrap circuit 70F supplies a voltage to activate the fourth switch element 61 (drive voltage) to the drive circuit 25G.

The bootstrap circuit 70G is connected between the bootstrap circuit 70F and the drive circuit 25H. The bootstrap circuit 70G includes a boot diode 71G and a boot capacitor 72G.

The anode of the boot diode 71G of the bootstrap circuit 70G is connected to the cathode of the boot diode 71F. The cathode of the boot diode 71G is connected to the high-potential power supply terminal THH of the drive circuit 25H. The boot capacitor 72G of the bootstrap circuit 70G includes a first terminal connected to the cathode of the boot diode 71G and the high-potential power supply terminal THH of the drive circuit 25H. The boot capacitor 72G includes a second terminal connected to the low-potential power supply terminal TLH of the drive circuit 25H. The bootstrap circuit 70G supplies a voltage to activate the fourth switch element 62 (drive voltage) to the drive circuit 25H.

In the present preferred embodiment, in the boot capacitors 72A to 72G of the bootstrap circuits 70A to 70G, the boot capacitors 72B, 72D, and 72F have a larger electrostatic capacitance than the remaining boot capacitors 72A, 72C, 72E, and 72G. When the boot capacitor 72B has a capacitance A1, the boot capacitor 72D has a capacitance A2, and the capacitance of the boot capacitor 72F has a capacitance A3, the relationship A1>A2>A3 is satisfied. The boot capacitor 72B is connected to the drive circuit 25C, which drives the switch element 41 located at the lowest potential side in the second switch group 40. The boot capacitor 72D is connected to the drive circuit 25E, which drives the switch element 51 located at the lowest potential side in the third switch group 50. The boot capacitor 72F is connected to the drive circuit 25G, which drives the switch element 61 located at the lowest potential side in the fourth switch group 60.

The switching circuit 20A further includes capacitors 28A to 28E. The capacitor 28A includes a first terminal connected to the first wire 21L. The capacitor 28A includes a second terminal connected to the second wire 21H. The capacitor 28A is connected in parallel to the switch circuit unit 24. The capacitor 28B includes a first terminal connected to the connection node N3. The capacitor 28B includes a second terminal connected to the connection node N6. The capacitor 28C includes a first terminal connected to the connection node N1. The capacitor 28C includes a second terminal connected to the connection node N2. The capacitor 28D includes a first terminal connected to the connection node N4. The capacitor 28D includes a second terminal connected to the connection node N5. The capacitors 28A, 28B, 28D are snubber capacitors. The capacitor 28C is used as a snubber capacitor and a flying capacitor. The capacitor 28E is a smoothing capacitor connected between the first wire 21L and the second wire 21H, that is, connected in parallel to the capacitor 28A. Although not shown in the drawings, a smoothing capacitor may be connected between the first wire 21L and the third wire 21M.

The operation of the power conversion device 20 will now be described.

For example, when the power conversion device 20 operates as a three-level converter, the controller 13 complementarily drives the first switches 31 and 32 of the first switch group 30 and the fourth switches 61 and 62 of the fourth switch group 60. Also, the controller 13 complementarily drives the second switches 41 and 42 of the second switch group 40 and the third switches 51 and 52 of the third switch group 50.

The switch circuit unit 24 is configured to operate in four states (modes) in accordance with a combination of the first to fourth switch groups 30, 40, 50, and 60 that are driven complementarily.

FIGS. 3 to 6 show the first to fourth modes of the switch circuit unit 24 in a first operation.

Figure 3:
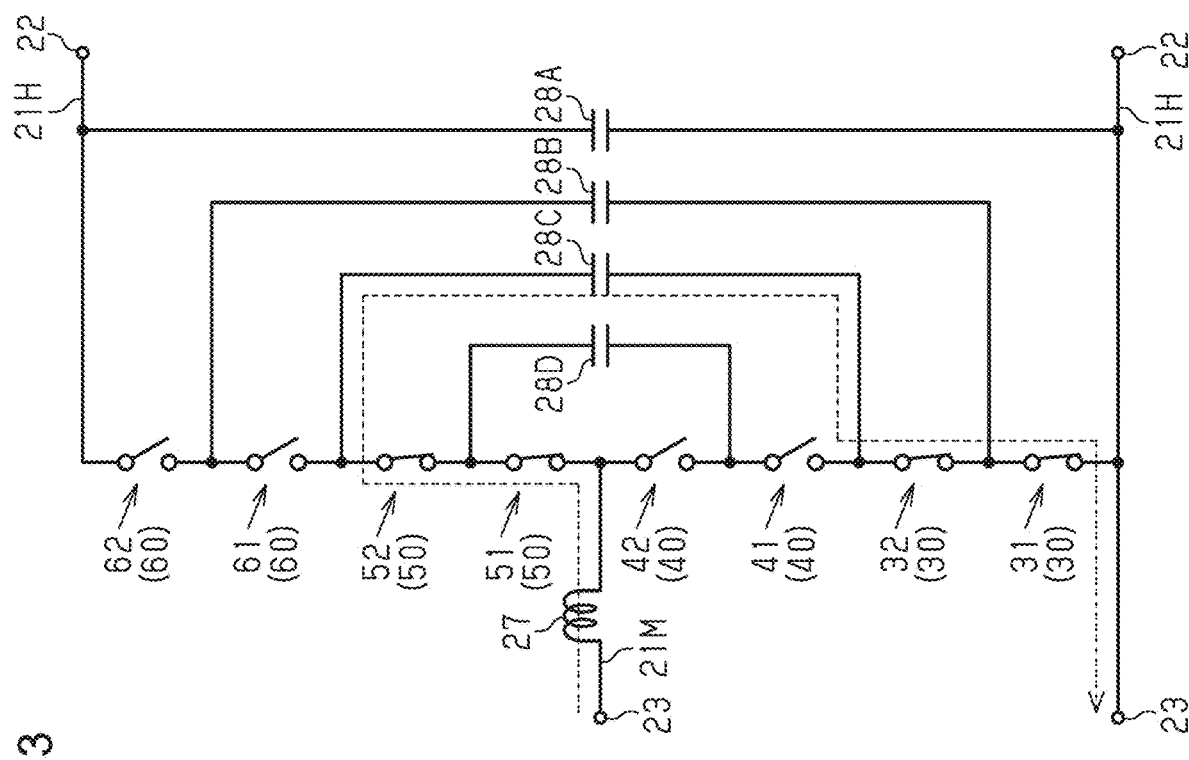
FIG. 3 is a circuit diagram showing a state of each switch element when the switching circuit according to the first preferred embodiment of the present invention is in a first mode.

As shown in FIG. 3, in the first mode, the first switches 31 and 32 of the first switch group 30 are activated, the second switches 41 and 42 of the second switch group 40 are deactivated, the third switches 51 and 52 of the third switch group 50 are activated, and the fourth switches 61 and 62 of the fourth switch group 60 are deactivated.

Figure 4:
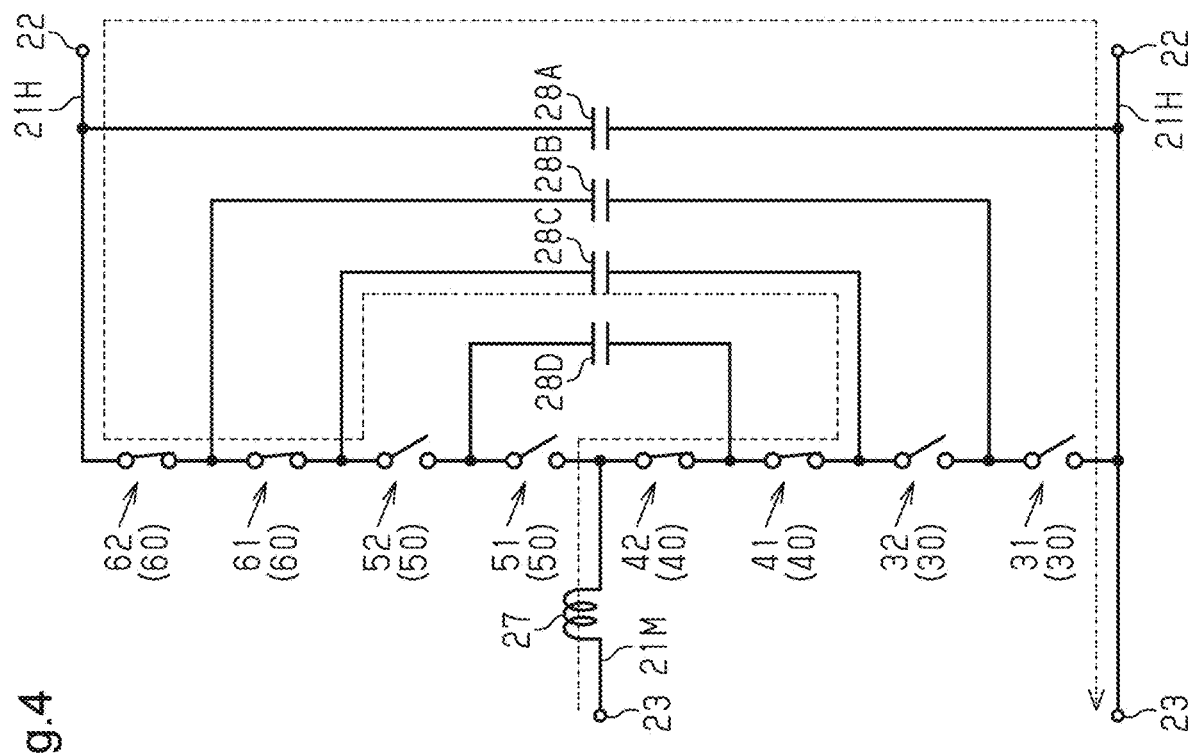
FIG. 4 is a circuit diagram showing a state of each switch element when the switching circuit according to the first preferred embodiment of the present invention is in a second mode.

As shown in FIG. 4, in the second mode, the first switches 31 and 32 of the first switch group 30 are deactivated, the second switches 41 and 42 of the second switch group 40 are activated, the third switches 51 and 52 of the third switch group are deactivated, and the fourth switches 61 and 62 of the fourth switch group 60 are activated.

Figure 5:
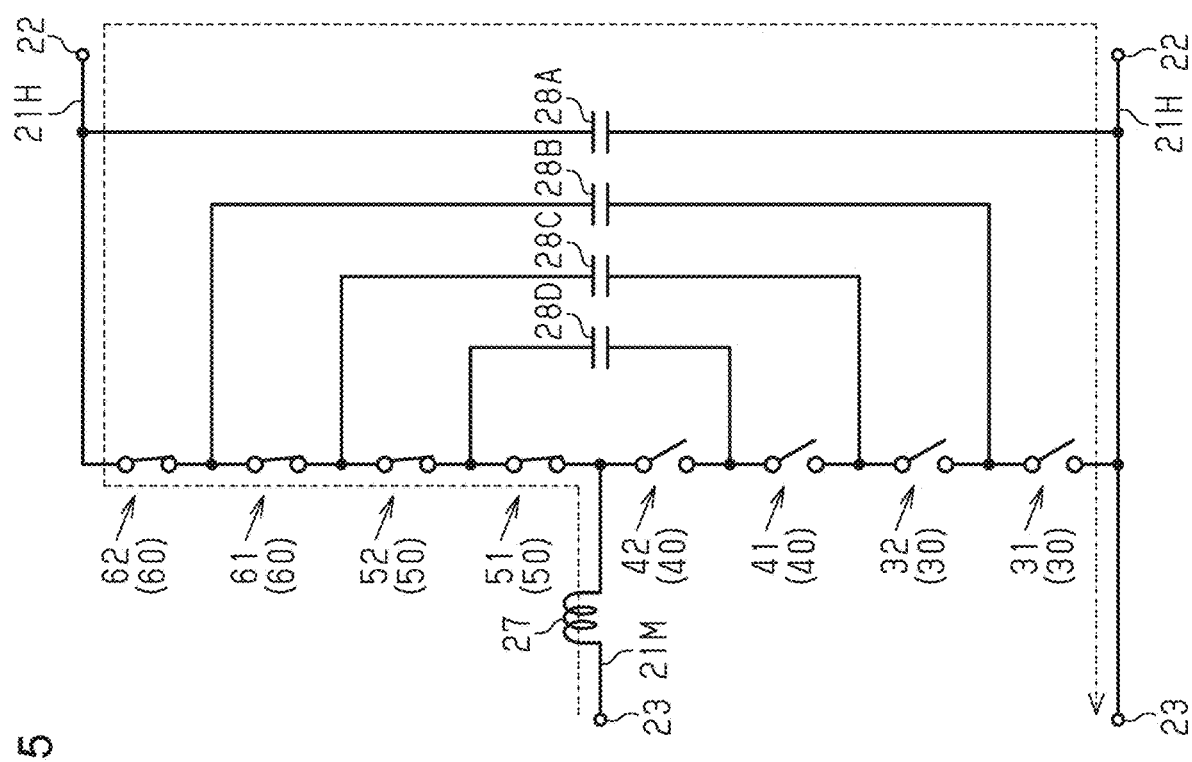
FIG. 5 is a circuit diagram showing a state of each switch element when the switching circuit according to the first preferred embodiment of the present invention is in a third mode.

As shown in FIG. 5, in the third mode, the first switches 31 and 32 of the first switch group 30 are deactivated, the second switches 41 and 42 of the second switch group 40 are deactivated, the third switches 51 and 52 of the third switch group 50 are activated, and the fourth switches 61 and 62 of the fourth switch group 60 are activated.

Figure 6:
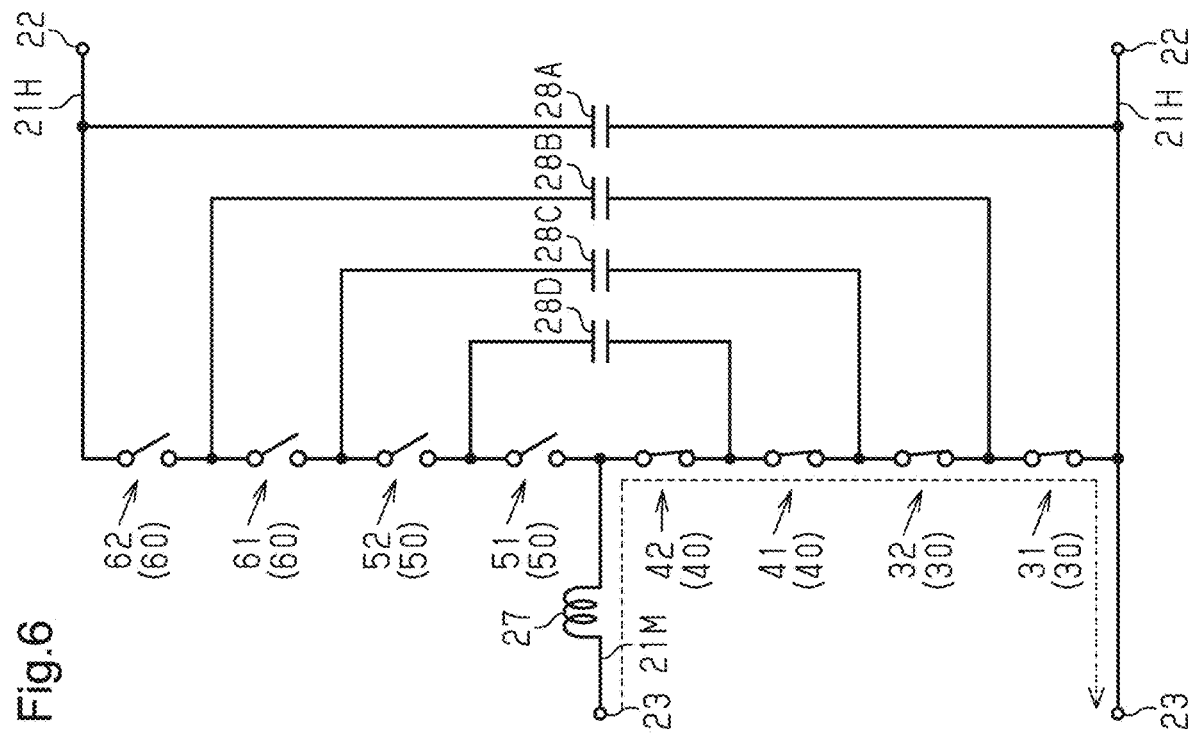
FIG. 6 is a circuit diagram showing a state of each switch element when the switching circuit according to the first preferred embodiment of the present invention is in a fourth mode.

As shown in FIG. 6, in the fourth mode, the first switches 31 and 32 of the first switch group 30 are activated, the second switches 41 and 42 of the second switch group 40 are activated, the third switches 51 and 52 of the third switch group are deactivated, and the fourth switches 61 and 62 of the fourth switch group 60 are deactivated.

In the present preferred embodiment, in the first operation, the duty ratio is controlled in accordance with a request power to control an output power. When the duty ratio is less than about 50%, the operation is in the first mode, the second mode, and the third mode. When the duty ratio is greater than about 50%, the operation is in the first mode, the second mode, and the fourth mode. When the duty ratio is equal to about 50%, the operation is in only the first mode and the second mode. That is, the first mode and the second mode are included in any case, and one of the third mode and the fourth mode is selected based on whether the duty ratio is less than or greater than about 50%.

During the complementary driving in the first operation, to prevent a flow of a through current, a dead time that deactivates all of the switches is provided before and after a time at which each of the switches 31, 32, 41, 42, 51, 52, 61, and 62 is turned on or turned off. It is known to a person skilled in the art that the dead time is inserted into the complementary driving.

The first operation is a power conversion operation executed by the power conversion device 20. More specifically, the power conversion device 20 executes the first operation to convert a direct current power of the high-voltage direct current bus 14 into a direct current power that charges the power storage device 3 and convert a direct current discharged from the power storage device 3 into a direct current power of the set voltage corresponding to the high-voltage direct current bus 14. In the present preferred embodiment, power is converted by a three-level voltage.

In order for the power conversion device 20 to execute the first operation, the boot capacitors 72A, 72B, 72C, 72D, 72E, 72F, and 72G of the bootstrap circuits 70A to 70G need to be charged to turn on the switches 31, 32, 41, 42, 51, 52, 61, and 62. To resolve this, a second operation is provided before the first operation. In an example of the second operation, the controller 13 sequentially activates the first switch element 31, which is located at the lowest potential side, the first switch element 32, the second switch element 41, the second switch element 42, the third switch element 51, the third switch element 52, and the fourth switch element 61 to sequentially charge the boot capacitors 72A and 72B of the bootstrap circuits 70A to 70G. At this time, the fourth switch element 62, which is located at the high potential side in the fourth switch group 60, is deactivated.

Figure 7:
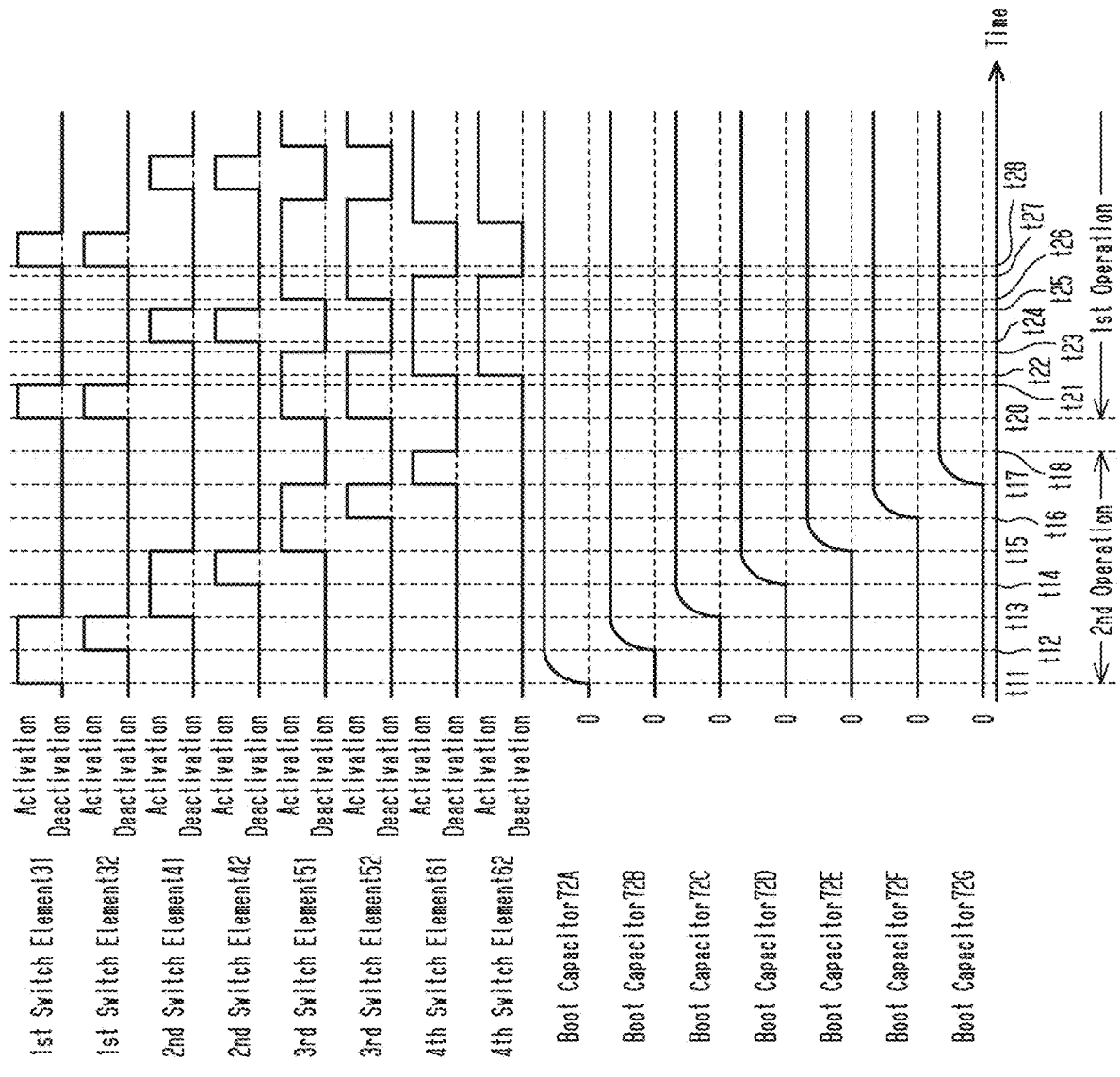
FIG. 7 is a time chart showing an example of an operation of the switching circuit according to the first preferred embodiment of the present invention.

An execution mode of a driving sequence of the power conversion device 20 starting from prior to activation and including the first operation and the second operation will now be described with reference to FIG. 7.

The controller 13 executes the second operation from time t11 to time t18.

At time t11, the controller 13 activates only the first switch element 31. At this time, the source of the first switch element 32 and the first wire 21L have the same or substantially the same potential through the first switch element 31, so that the power supply 26L charges the boot capacitor 72A of the bootstrap circuit 70A. The potential of the boot capacitor 72A increases as time elapses from time t11. At time t12, the boot capacitor 72A is fully charged. The potential of the boot capacitor 72A refers to the potential of one of the two electrodes of the boot capacitor 72A that is connected to the boot diode 71A. The fully charged state of the boot capacitor 72A refers to a state in which the voltage is greater than or equal to the voltage needed to activate the first switch element 32 (drive voltage) and the potential difference between the two electrodes of the boot capacitor 72A is equal or substantially equal to the potential difference between the two terminals of the power supply 26L. The same applies to the remaining boot capacitors described below.

At time t12, the controller 13 activates the first switch element 32. That is, after the boot capacitor 72A reaches the voltage needed to activate the first switch element 32, the controller 13 activates the first switch element 32. At this time, the first switch element 31 remains activated. When the first switch element 32 is activated, the source of the second switch element 41 and the first wire 21L have the same or substantially the same potential through the first switch element 31 and the first switch element 32. This allows the power supply 26L to charge the boot capacitor 72B of the bootstrap circuit 70B. The potential of the boot capacitor 72B increases as time elapses from time t12. At time t13, the boot capacitor 72B is fully charged. At time t13, the boot capacitor 72A is also fully charged. At time t13, the controller 13 deactivates the first switch element 31 and the first switch element 32.

At time t13, the controller 13 activates the second switch element 41. That is, after the boot capacitor 72B reaches the voltage needed to activate the second switch element 41, the controller 13 activates the second switch element 41. As a result, the boot capacitor 72C is charged with the charge accumulated on the boot capacitor 72B. The potential of the boot capacitor 72C increases as time elapses from time t13. At time t14, the boot capacitor 72C is fully charged.

At time t14, the controller 13 activates the second switch element 42. That is, after the boot capacitor 72C reaches the voltage needed to activate the second switch element 42, the controller 13 activates the second switch element 42. At this time, the second switch element 41 remains activated. When the second switch element 42 is activated, the boot capacitor 72D is charged with the charge accumulated on the boot capacitor 72B. The potential of the boot capacitor 72D increases as time elapses from time t14. At time t15, the boot capacitor 72D is fully charged. At time t15, the controller 13 deactivates the second switch element 41 and the second switch element 42.

At time t15, the controller 13 activates the third switch element 51. That is, after the boot capacitor 72D reaches the voltage needed to activate the third switch element 51, the controller 13 activates the third switch element 51. As a result, the boot capacitor 72E is charged with the charge accumulated on the boot capacitor 72D. The potential of the boot capacitor 72E increases as time elapses from time t15. At time t16, the boot capacitor 72E is fully charged.

At time t16, the controller 13 activates the third switch element 52. That is, after the boot capacitor 72E reaches the voltage needed to activate the third switch element 52, the controller 13 activates the third switch element 52. At this time, the third switch element 51 remains activated. When the third switch element 52 is activated, the boot capacitor 72F is charged with the charge accumulated on the boot capacitor 72D. The potential of the boot capacitor 72F increases as time elapses from time t16. At time t17, the boot capacitor 72F is fully charged. At time t17, the controller 13 deactivates the third switch element 51 and the third switch element 52.

At time t17, the controller 13 activates the fourth switch element 61. That is, after the boot capacitor 72F reaches the voltage needed to activate the fourth switch element 61, the controller 13 activates the fourth switch element 61. As a result, the boot capacitor 72G is charged with the charge accumulated on the boot capacitor 72F. The potential of the boot capacitor 72G increases as time elapses from time t17. At time t18, the boot capacitor 72G is fully charged. At time t18, the controller 13 deactivates the fourth switch element 61.

After time t18, at time t20 or later, the controller 13 executes the first operation.

At time t20, the controller 13 activates the first switches 31 and 32 and the third switches 51 and 52. After time t20, at time t21, the controller 13 deactivates only the first switches 31 and 32, while the third switches 51 and 52 remain activated. From time t20 to time t21, the second switches 41 and 42 and the fourth switches 61 and 62 remain deactivated. That is, from time t20 to time t21, the operation is in the first mode.

After time t21, at time t22, the controller 13 activates the fourth switches 61 and 62. After time t22, at time t23, the controller 13 deactivates only the third switches 51 and 52, while the fourth switches 61 and 62 remain activated. From time t22 to time t23, the first switches 31 and 32 and the second switches 41 and 42 remain deactivated. That is, from time t22 to time t23, the operation is in the third mode.

After time t23, at time t24, the controller 13 activates the second switches 41 and 42. After time t24, at time t25, the controller 13 deactivates only the second switches 41 and 42, while the fourth switches 61 and 62 remain activated. From time t24 to time t25, the first switches 31 and 32 and the third switches 51 and 52 remain deactivated. That is, from time t24 to time t25, the operation is in the second mode.

After time t25, at time t26, the controller 13 activates the third switches 51 and 52. After time t26, at time t27, the controller 13 deactivates only the fourth switches 61 and 62, while the second switches 41 and 42 remain activated. From time t26 to time t27, the first switches 31 and 32 and the second switches 41 and 42 remain deactivated. That is, from time t26 to time t27, the operation is in the third mode.

After time t27, at time t28 or later, the controller 13 repeats the operation of time t20 to time t27 as described above. In this case, the duty ratio of the first switches 31 and 32 and the second switches 41 and 42 is constantly less than about 50%.

Figure 8:
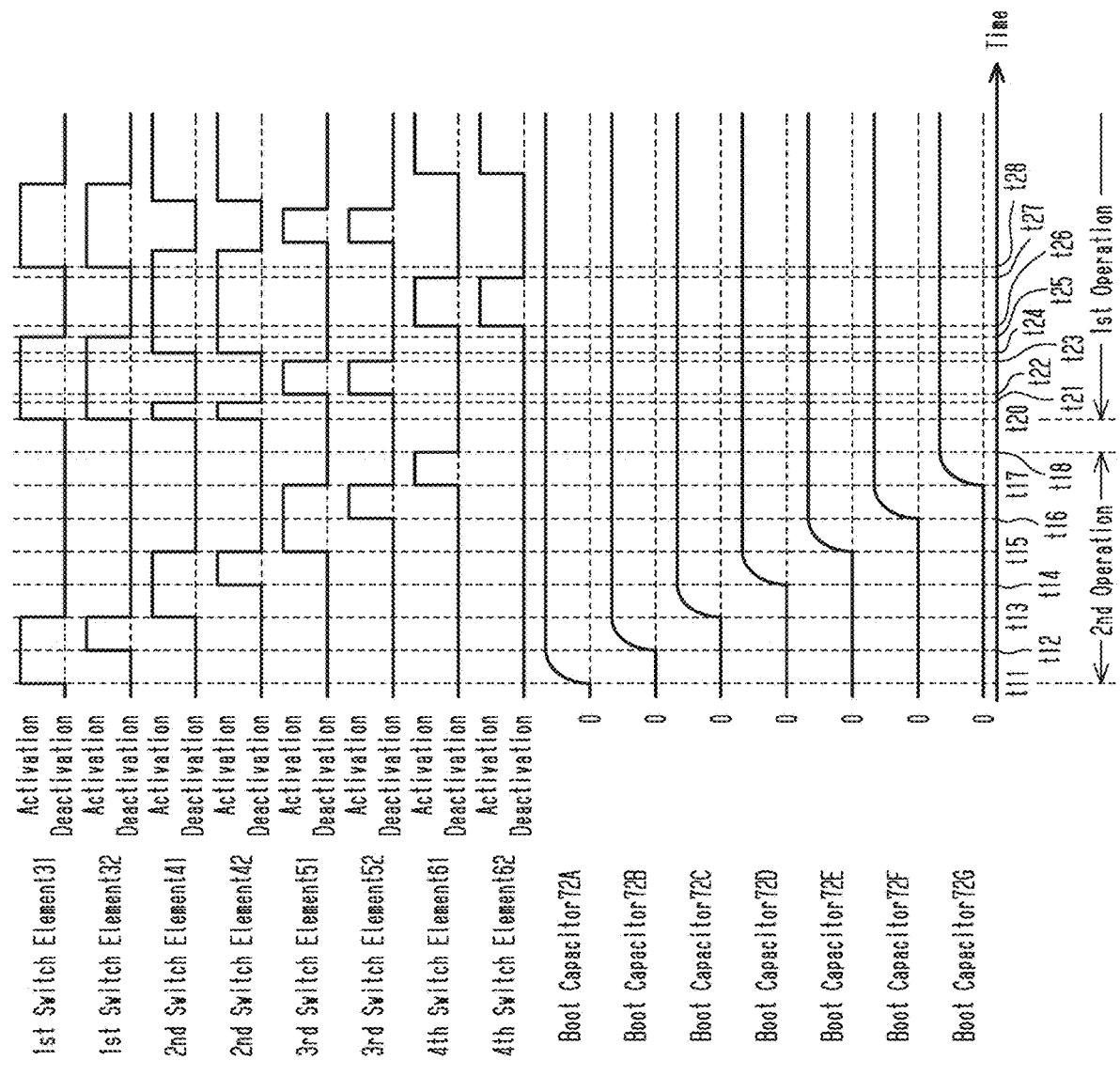
FIG. 8 is a time chart showing an example of an operation of the switching circuit according to the first preferred embodiment of the present invention.

An execution mode of the power conversion device 20 executed by the controller 13 when the duty ratio of the first switches 31 and 32 and the second switches 41 and 42 is greater than about 50% will now be described with reference to FIG. 8. The modified example of a preferred embodiment of the present invention shown in FIG. 8 and the example of the present preferred embodiment shown in FIG. 7 differ in the first operation.

From time t11 to time t18, the controller 13 executes the second operation as described above.

After time t18, at time t20 or later, the controller 13 executes the first operation.

At time t20, the controller 13 activates the first switches 31 and 32 and the second switches 41 and 42. After time t20, at time t21, the controller 13 deactivates only the second switches 41 and 42, while the first switches 31 and 32 remain activated. From time t20 to time t21, the third switches 51 and 52 and the fourth switches 61 and 62 remain deactivated. That is, from time t20 to time t21, the operation is in the fourth mode.

After time t21, at time t22, the controller 13 activates the third switches 51 and 52. After time t22, at time t23, the controller 13 deactivates only the third switches 51 and 52, while the first switches 31 and 32 remain activated. From time t22 to time t23, the second switches 41 and 42 and the fourth switches 61 and 62 remain deactivated. That is, from time t22 to time t23, the operation is in the first mode.

After time t23, at time t24, the controller 13 activates the second switches 41 and 42. After time t24, at time t25, the controller 13 deactivates only the first switches 31 and 32, while the second switches 41 and 42 remain activated. From time t24 to time t25, the third switches 51 and 52 and the fourth switches 61 and 62 remain deactivated. That is, from time t24 to time t25, the operation is in the fourth mode.

After time t25, at time t26, the controller 13 activates the fourth switches 61 and 62. After time t26, at time t27, the controller 13 deactivates only the fourth switches 61 and 62, while the second switches 41 and 42 remain activated. From time t26 to time t27, the first switches 31 and 32 and the third switches 51 and 52 remain deactivated. That is, from time t26 to time t27, the operation is in the second mode.

After time t27, at time t28 or later, the controller 13 repeats the operation of time t20 to time t27 as described above.

The present preferred embodiment has the following advantages.

(1-1) The anodes of the boot diodes 71C, 71E, and 71G of the bootstrap circuits 70C, 70E, and 70G, which are located at the high-potential side, are connected to the cathodes of the boot diodes 71B, 71D, and 71F of the bootstrap circuits 70B, 70D, and 70F, which are located at the low-potential side. With this configuration, for example, when complementarily driving the switches 31, 32, 41, 42, 51, 52, 61, and 62, power is supplied from the boot capacitors 72B, 72D, and 72F of the bootstrap circuits 70B, 70D, and 70F to the boot capacitors 72C, 72E, and 72G of the bootstrap circuit 70C, 70E, and 70G even if the supply of power from the power supply 26L is stopped. Thus, a three-level output is obtained with the switch circuit unit 24 including the first to fourth switch groups 30, 40, 50, and 60 including the n switches 31, 32, 41, 42, 51, 52, 61, and 62.

(1-2) In the boot capacitors 72A to 72G, the boot capacitors 72B, 72D, and 72F have a larger electrostatic capacitance than the boot capacitors 72A, 72C, 72E, and 72G. In addition, the capacitance A1 of the boot capacitor 72B, the capacitance A2 of the boot capacitor 72D, and the capacitance A3 of the boot capacitor 72F is set so that A1>A2>A3 is satisfied. Thus, the power is supplied to the remaining boot capacitors 72C, 72E, and 72G to charge the boot capacitors 72C, 72E, and 72G.

(1-3) The controller 13 executes the second operation before the first operation to charge the boot capacitors 72A to 72G of the bootstrap circuits 70A to 70G, so that each of the switches 31, 32, 41, 42, 51, 52, 61, and 62 is activated. More specifically, in the second operation, which is executed before the first operation, the boot capacitors 72A to 72G of the bootstrap circuits 70A to 70G are charged by activating in order starting from the switch element 31, which is the lowest potential side in the first switch group 30, while maintaining the deactivation state of the switch element 62, which is the highest potential one of the switches 61 and 62 in the fourth switch group 60. This enables, for example, simultaneous activation of the switches 31 and 32 in the first switch group 30. Also, simultaneous activation of the second switches 41 and 42 is enabled. Also, simultaneous activation of the third switches 51 and 52 is enabled. Also, simultaneous activation of the fourth switches 61 and 62 is enabled.

Second Preferred Embodiment

A switching circuit 20A according to a second preferred embodiment of the present invention will now be described with reference to FIGS. 11 and 12. The switching circuit 20A of the present preferred embodiment differs from the switching circuit 20A of the first preferred embodiment in that the bootstrap circuit 70D is omitted and a power supply 26H is included. In the description below, the same reference characters denote those components that are the same or substantially the same as the corresponding components of the first preferred embodiment. Such components will not be described in detail.

Figure 11:
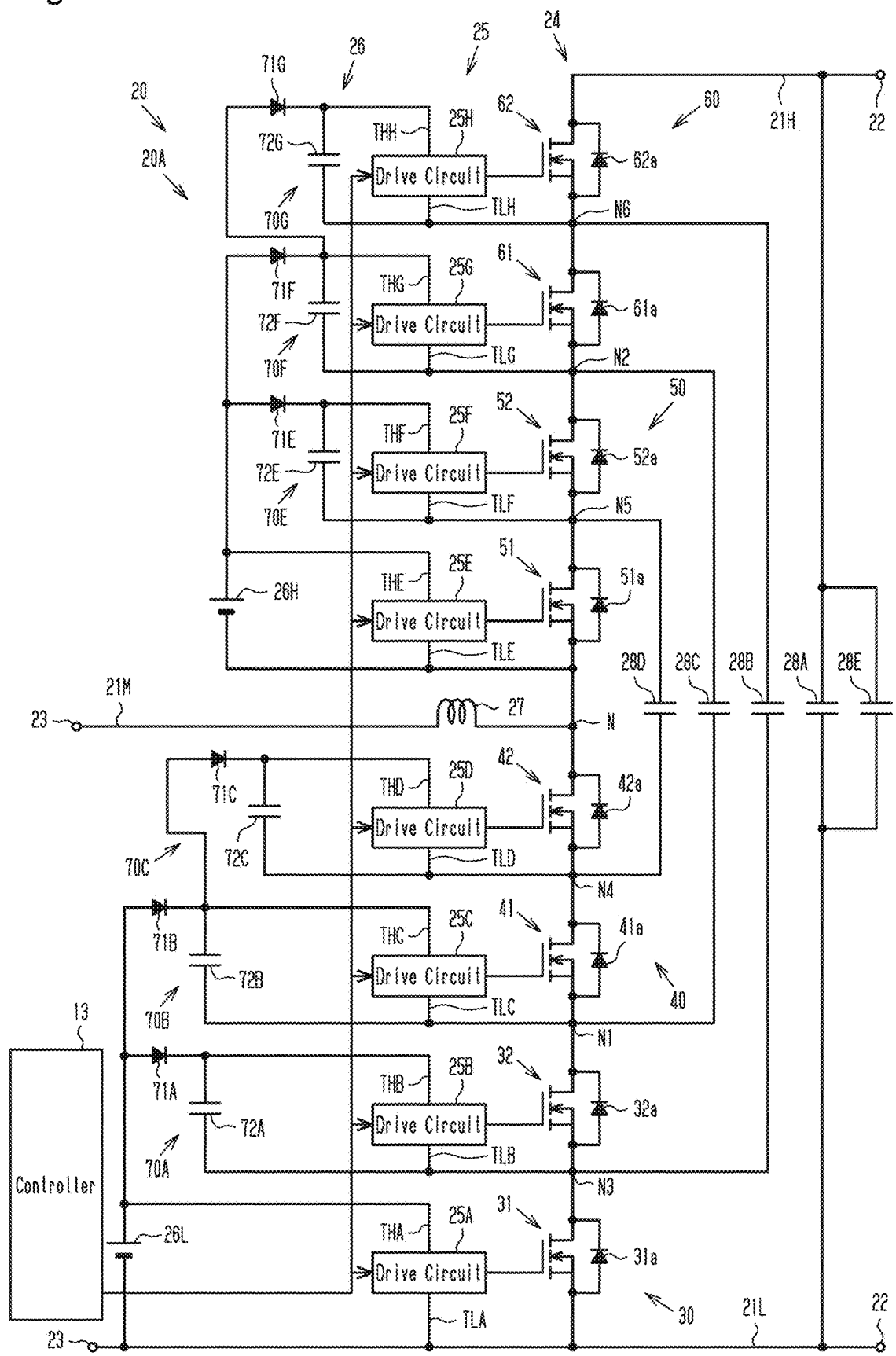
FIG. 11 is a circuit diagram showing a switching circuit according to a second preferred embodiment of the present invention.
Figure 12:
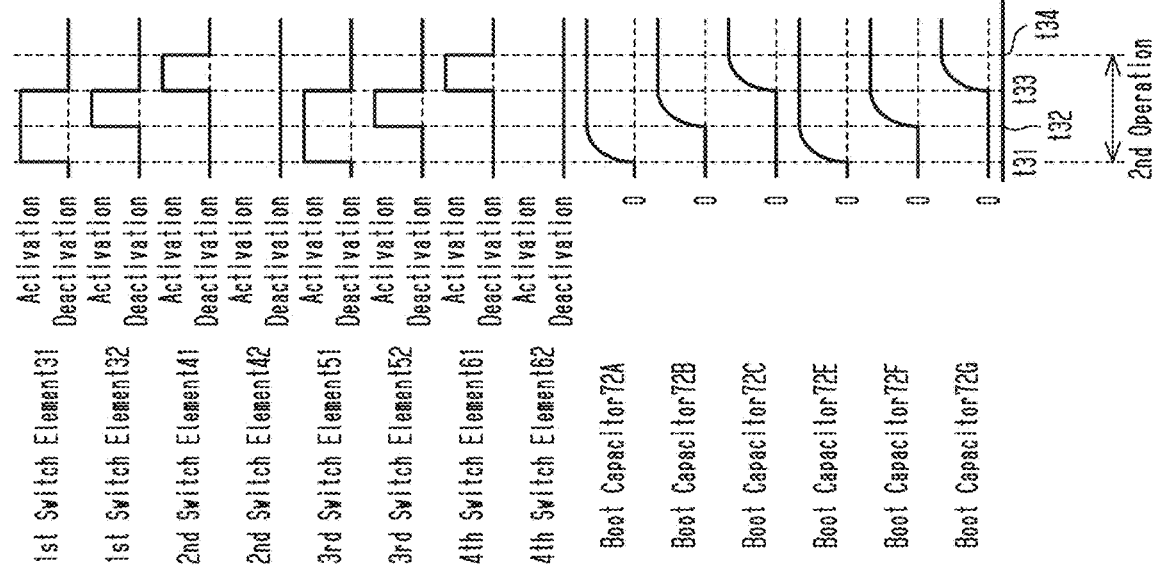
FIG. 12 is a time chart showing an example of operation of the switching circuit according to the second preferred embodiment of the present invention.

As shown in FIG. 11, in the present preferred embodiment, the power supply circuit 26 includes the power supply 26L and the power supply 26H. The power supply 26L supplies power to the drive circuit 25A, which is located at the low potential side. The power supply 26H supplies power to the drive circuit 25E, which is located at the high potential side. The power supply 26L corresponds to a first power supply. The power supply 26H corresponds to a second power supply. The drive circuits 25A to 25D correspond to a first drive circuit. The drive circuits 25E to 25H correspond to a second drive circuit.

The power supply 26H is preferably, for example, a direct current power supply. The power supply 26H is connected to the drive circuit 25E, which is located closest to the third wire 21M among the drive circuits 25E to 25H. More specifically, a negative terminal of the power supply 26H is connected to the connection node N, and a positive terminal of the power supply 26H is connected to the high-potential power supply terminal THE of the drive circuit 25E.

In the present preferred embodiment, among the boot capacitors 72A to 72C of the bootstrap circuits 70A to 70C, the boot capacitor 72B has a larger electrostatic capacitance than the remaining boot capacitors 72A and 72C. Among the boot capacitors 72E to 72G of the bootstrap circuits 70E to 70G, the boot capacitor 72F has a larger electrostatic capacitance than the remaining boot capacitors 72E and 72G. Therefore, the boot capacitor 72B charges the boot capacitor 72C, and the boot capacitor 72F charges the boot capacitor 72G.

The second operation of the present preferred embodiment differs from the second operation of the first preferred embodiment. The second operation of the present preferred embodiment sequentially activates the first switch element 31, the first switch element 32, and the second switch element 41, and sequentially activates the third switch element 51, the third switch element 52, and the fourth switch element 61.

An execution mode of the power conversion device 20 driven by the controller 13 will now be described with reference to FIG. 12.

The controller 13 executes the second operation from time t31 to time t34 and then executes the first operation. The first operation is the same as or substantially the same as that of the first preferred embodiment and thus will not be shown in FIG. 12.

At time t31, the controller 13 activates the first switch element 31 and the third switch element 51. This allows the power supply 26L to charge the boot capacitor 72A of the bootstrap circuit 70A and allows the power supply 26H to charge the boot capacitor 72E of the bootstrap circuit 70E.

After time t31, at time t32, the controller 13 activates the first switch element 32 and the third switch element 52. This allows the power supply 26L to charge the boot capacitor 72B of the bootstrap circuit 70B and allows the power supply 26H to charge the boot capacitor 72F of the bootstrap circuit 70F.

After time t32, at time t33, the controller 13 deactivates the first switches 31 and 32 and the third switches 51 and 52 and activates the second switch element 41 and the fourth switch element 61. As a result, the boot capacitor 72C of the bootstrap circuit 70C is charged with the charge accumulated on the boot capacitor 72B, and the boot capacitor 72G of the bootstrap circuit 70G is charged with the charge accumulated on the boot capacitor 72F. After time t33, at time t34, the controller 13 deactivates the second switch element 41 and the fourth switch element 61.

The present preferred embodiment has the following advantages.

(2-1) The anodes of the boot diodes 71C and 71G of the bootstrap circuits 70C and 70G, which are located at the high-potential side, are connected to the cathodes of the boot diodes 71B and 71F of the bootstrap circuits 70B and 70F, which are located at the low-potential side. With this configuration, for example, when complementarily driving the switches 31, 32, 41, 42, 51, 52, 61, and 62, power is supplied from the boot capacitors 72B and 72F of the bootstrap circuits 70B and 70F to the boot capacitors 72C and 72G of the bootstrap circuits 70C and 70G even if the supply of power from the power supplies 26L and 26H is stopped. Thus, a three-level output is obtained with the switch circuit unit 24 including the first to fourth switch groups 30, 40, 50, and 60 including the n switches 31, 32, 41, 42, 51, 52, 61, and 62.

(2-2) The boot capacitor 72B of the bootstrap circuit 70B, which is connected to the drive circuit 25C, has a larger electrostatic capacitance than the boot capacitors 72A and 72C of the remaining bootstrap circuits 70A and 70C, which are connected to the drive circuits 25B and 25D. The bootstrap circuit 70F, which is connected to the drive circuit 25G, has a larger electrostatic capacitance than the boot capacitors 72E and 72G of the bootstrap circuits 70E and 70G, which are connected to the drive circuits 25F and 25H. With this configuration, the boot capacitor 72B and the boot capacitor 72F supply power to the boot capacitor 72C and the boot capacitor 72G to charge the boot capacitor 72C and the boot capacitor 72G.

(2-3) The controller 13 executes the second operation before the first operation to charge the boot capacitors 72A to 72C and 72E to 72G of the bootstrap circuits 70A to 70C and 70E to 70G, so that each of the switches 31, 32, 41, 42, 51, 52, 61, and 62 is activated. More specifically, in the second operation, which is executed before the first operation, the boot capacitors 72A to 72C of the bootstrap circuits 70A to 70C are charged by activating in order starting from the switch element 31, which is the lowest potential side in the first switch group 30, while maintaining the deactivation state of the switch element 42, which is the highest potential one of the second switches 41 and 42. In the same manner, in the second operation, which is executed before the first operation, the boot capacitors 72E to 72G of the bootstrap circuits 70E to 70G are charged by activating in order starting from the switch element 51, which is the lowest potential side in the third switch group 50, while maintaining the deactivation state of the switch element 62, which is the highest potential one of the switches 61 and 62 in the fourth switch group 60.

(2-4) In the second operation, the controller 13 simultaneously activates the first switch element 31 and the third switch element 51, simultaneously activates the first switch element 32 and the third switch element 52, and simultaneously activates the second switch element 41 and the fourth switch element 61. This shortens the charging time.

Third Preferred Embodiment

A switching circuit 20A according to a third preferred embodiment of the present invention will now be described with reference to FIGS. 16 and 17. The switching circuit 20A of the present preferred embodiment differs from the switching circuit 20A of the first preferred embodiment in the configuration of the controller 13. In the description below, the same reference characters denote components that are the same or substantially the same as the corresponding components of the first preferred embodiment. Such components will not be described in detail.

Figure 16:
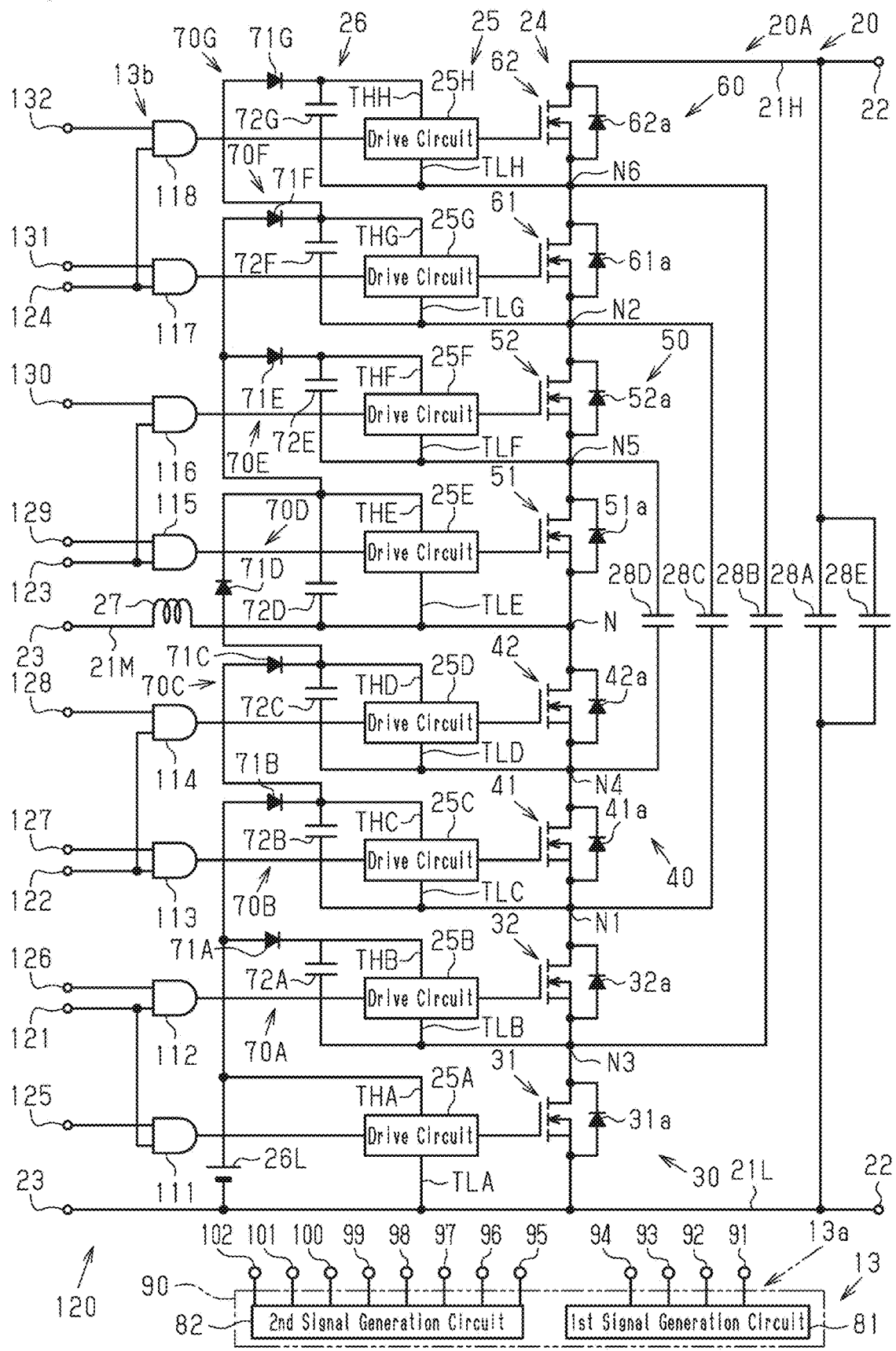
FIG. 16 is a circuit diagram showing a switching circuit according to a third preferred embodiment of the present invention.
Figure 17:
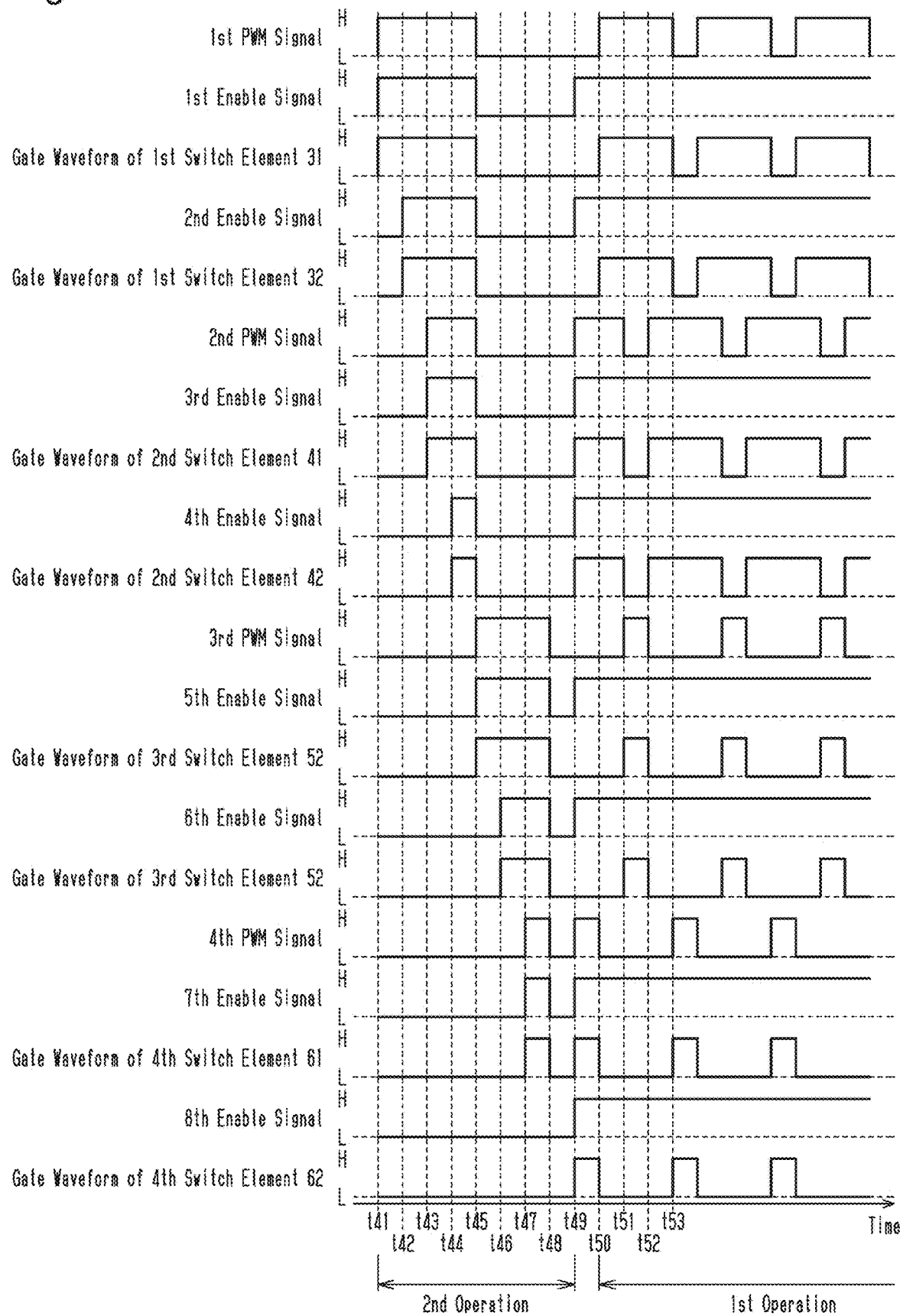
FIG. 17 is a time chart showing an example of an operation of the switching circuit according to the third preferred embodiment of the present invention.

As shown in FIG. 16, the controller 13 includes a control circuit 13*a* and a logic circuit 13*b*. In the same or substantially the same manner as the first preferred embodiment, the controller 13 further includes storage.

The control circuit 13*a* includes a first signal generation circuit 81 configured to generate a PWM (pulse width modulation) signal that drives the first to fourth switch groups 30, 40, 50, and 60 and a second signal generation circuit 82 configured to generate an enable signal that provides instructions to validate or invalidate an output of a PWM signal to the drive circuits 25A to 25H of the first to fourth switch groups 30, 40, 50, and 60. In the present preferred embodiment, the first signal generation circuit 81 separately generates a first PWM signal that drives the first switch group 30, a second PWM signal that drives the second switch group 40, a third PWM signal that drives the third switch group 50, and a fourth PWM signal that drives the fourth switch group 60. The second signal generation circuit 82 generates first to eighth enable signals. The first enable signal instructs to validate or invalidate an output of the first PWM signal to the drive circuit 25A. The second enable signal instructs to validate or invalidate an output of the first PWM signal to the drive circuit 25B. The third enable signal instructs to validate or invalidate an output of the second PWM signal to the drive circuit 25C. The fourth enable signal instructs to validate or invalidate an output of the second PWM signal to the drive circuit 25D. The fifth enable signal instructs to validate or invalidate an output of the third PWM signal to the drive circuit 25E. The sixth enable signal instructs to validate or invalidate an output of the third PWM signal to the drive circuit 25F. The seventh enable signal instructs to validate or invalidate an output of the fourth PWM signal to the drive circuit 25G. The eighth enable signal instructs to validate or invalidate an output of the fourth PWM signal to the drive circuit 25H.

In the present preferred embodiment, the control circuit 13a preferably is a single package of an integrated circuit 90. The integrated circuit 90 includes terminals 91 to 102. The terminals 91 to 94 are electrically connected to the first signal generation circuit 81. The terminal 91 outputs the first PWM signal. The terminal 92 outputs the second PWM signal. The terminal 93 outputs the third PWM signal. The terminal 94 outputs the fourth PWM signal. The terminal 95 outputs the first enable signal. The terminal 96 outputs the second enable signal. The terminal 97 outputs the third enable signal. The terminal 98 outputs the fourth enable signal. The terminal 99 outputs the fifth enable signal. The terminal 100 outputs the sixth enable signal. The terminal 101 outputs the seventh enable signal. The terminal 102 outputs the eighth enable signal.

The logic circuit 13b is electrically connected to the first signal generation circuit 81 and the second signal generation circuit 82. When the enable signal is at a high level and a PWM signal is input to the logic circuit 13b, the logic circuit 13b outputs the PWM signal to the drive circuits 25A to 25H. The logic circuit 13b includes AND circuits (in the present preferred embodiment, eight AND circuits 111 to 118, for example). The number of AND circuits included in the logic circuit 13b equals the total number of switches in the first to fourth switch groups 30, 40, 50, and 60.

The AND circuit 111 includes a first input terminal that is electrically connected to the terminal 91 of the integrated circuit 90 and a second input terminal that is electrically connected to the terminal 95. The AND circuit 111 includes an output terminal electrically connected to the drive circuit 25A. When the first enable signal is at a high level and the first PWM signal is input to the AND circuit 111, the AND circuit 111 outputs the first PWM signal to the drive circuit 25A. When the first enable signal is at a low level and the first PWM signal is input to the AND circuit 111, the AND circuit 111 does not output the first PWM signal to the drive circuit 25A.

The AND circuit 112 includes a first input terminal that is electrically connected to the terminal 91 of the integrated circuit 90 and a second input terminal that is electrically connected to the terminal 96. The AND circuit 112 includes an output terminal electrically connected to the drive circuit 25B. When the second enable signal is at the high level and the first PWM signal is input to the AND circuit 112, the AND circuit 112 outputs the first PWM signal to the drive circuit 25B. When the second enable signal is at the low level and the first PWM signal is input to the AND circuit 112, the AND circuit 112 does not output the first PWM signal to the drive circuit 25B.

The AND circuit 113 includes a first input terminal that is electrically connected to the terminal 92 of the integrated circuit 90 and a second input terminal that is electrically connected to the terminal 97. The AND circuit 113 includes an output terminal electrically connected to the drive circuit 25C. When the third enable signal is at the high level and the second PWM signal is input to the AND circuit 113, the AND circuit 113 outputs the second PWM signal to the drive circuit 25C. When the third enable signal is at the low level and the second PWM signal is input to the AND circuit 113, the AND circuit 113 does not output the second PWM signal to the drive circuit 25C.

The AND circuit 114 includes a first input terminal that is electrically connected to the terminal 92 of the integrated circuit 90 and a second input terminal that is electrically connected to the terminal 98. The AND circuit 114 includes an output terminal electrically connected to the drive circuit 25D. When the fourth enable signal is at the high level and the second PWM signal is input to the AND circuit 114, the AND circuit 114 outputs the second PWM signal to the drive circuit 25D. When the fourth enable signal is at the low level and the second PWM signal is input to the AND circuit 114, the AND circuit 114 does not output the second PWM signal to the drive circuit 25D.

The AND circuit 115 includes a first input terminal that is electrically connected to the terminal 93 of the integrated circuit 90 and a second input terminal that is electrically connected to the terminal 99. The AND circuit 115 includes an output terminal electrically connected to the drive circuit 25E. When the fifth enable signal is at the high level and the third PWM signal is input to the AND circuit 115, the AND circuit 115 outputs the third PWM signal to the drive circuit 25E. When the fifth enable signal is at the low level and the third PWM signal is input to the AND circuit 115, the AND circuit 115 does not output the third PWM signal to the drive circuit 25E.

The AND circuit 116 includes a first input terminal that is electrically connected to the terminal 93 of the integrated circuit 90 and a second input terminal that is electrically connected to the terminal 100. The AND circuit 116 includes an output terminal electrically connected to the drive circuit 25F. When the sixth enable signal is at the high level and the third PWM signal is input to the AND circuit 116, the AND circuit 116 outputs the third PWM signal to the drive circuit 25F. When the sixth enable signal is at the low level and the third PWM signal is input to the AND circuit 116, the AND circuit 116 does not output the third PWM signal to the drive circuit 25F.

The AND circuit 117 includes a first input terminal that is electrically connected to the terminal 94 of the integrated circuit 90 and a second input terminal that is electrically connected to the terminal 101. The AND circuit 117 includes an output terminal electrically connected to the drive circuit 25G. When the seventh enable signal is at the high level and the fourth PWM signal is input to the AND circuit 117, the AND circuit 117 outputs the fourth PWM signal to the drive circuit 25G. When the seventh enable signal is at the low level and the fourth PWM signal is input to the AND circuit 117, the AND circuit 117 does not output the fourth PWM signal to the drive circuit 25G.

The AND circuit 118 includes a first input terminal that is electrically connected to the terminal 94 of the integrated circuit 90 and a second input terminal that is electrically connected to the terminal 102. The AND circuit 118 includes an output terminal electrically connected to the drive circuit 25H. When the eighth enable signal is at the high level and the fourth PWM signal is input to the AND circuit 118, the AND circuit 118 outputs the fourth PWM signal to the drive circuit 25H. When the eighth enable signal is at the low level and the fourth PWM signal is input to the AND circuit 118, the AND circuit 118 does not output the fourth PWM signal to the drive circuit 25H.

In the present preferred embodiment, the logic circuit 13b and the switching circuit 20A are a single package of an integrated circuit 120. The integrated circuit 120 includes the terminals 121 to 132, in addition to two first input/output portions 22 and two second input/output portions 23. The terminal 121 receives the first PWM signal and is electrically connected to the first input terminal of each of the AND circuits 111 and 112. The terminal 121 is electrically connected to the terminal 91 of the integrated circuit 90. The terminal 122 receives the second PWM signal and is electrically connected to the first input terminal of each of the AND circuits 113 and 114. The terminal 122 is electrically connected to the terminal 92 of the integrated circuit 90. The terminal 123 receives the third PWM signal and is electrically connected to the first input terminal of each of the AND circuits 115 and 116. The terminal 123 is electrically connected to the terminal 93 of the integrated circuit 90. The terminal 124 receives the fourth PWM signal and is electrically connected to the first input terminal of each of the AND circuits 117 and 118. The terminal 124 is electrically connected to the terminal 94 of the integrated circuit 90. The terminal 125 receives the first enable signal and is electrically connected to the second input terminal of the AND circuit 111. The terminal 125 is electrically connected to the terminal 95 of the integrated circuit 90. The terminal 126 receives the second enable signal and is electrically connected to the second input terminal of the AND circuit 112. The terminal 126 is electrically connected to the terminal 96 of the integrated circuit 90. The terminal 127 receives the third enable signal and is electrically connected to the second input terminal of the AND circuit 113. The terminal 127 is electrically connected to the terminal 97 of the integrated circuit 90. The terminal 128 receives the fourth enable signal and is electrically connected to the second input terminal of the AND circuit 114. The terminal 128 is electrically connected the terminal 98 of the integrated circuit 90. The terminal 129 receives the fifth enable signal and is electrically connected to the second input terminal of the AND circuit 115. The terminal 129 is electrically connected the terminal 99 of the integrated circuit 90. The terminal 130 receives the sixth enable signal and is electrically connected to the second input terminal of the AND circuit 116. The terminal 130 is electrically connected the terminal 100 of the integrated circuit 90. The terminal 131 receives the seventh enable signal and is electrically connected to the second input terminal of the AND circuit 117. The terminal 131 is electrically connected to the terminal 101 of the integrated circuit 90. The terminal 132 receives the eighth enable signal and is electrically connected to the second input terminal of the AND circuit 118. The terminal 132 is electrically connected to the terminal 102 of the integrated circuit 90. The power supply circuit 26 of the present preferred embodiment and the power supply circuit 26 of the first preferred embodiment have the same or substantially the same configurations.

In the second operation according to the present preferred embodiment, the controller 13 sequentially activates the first switch element 31, which is located at the lowest potential side, the first switch element 32, the second switch element 41, the second switch element 42, the third switch element 51, the third switch element 52, and the fourth switch element 61 to sequentially charge the boot capacitors 72A to 72G of the bootstrap circuits 70A to 70G. At this time, the fourth switch element 62, which is located at the high potential side in the fourth switch group 60, is deactivated.

An execution mode of a driving sequence of the power conversion device 20 starting from prior to activation and including the first operation and the second operation will now be described with reference to FIG. 17.

The controller 13 executes the second operation from time t41 to time t48.

At time t41, the controller 13 sets each of the first PWM signal and the first enable signal to the high level. As a result, the first switch element 31 is activated, so that the boot capacitor 72A of the bootstrap circuit 70A is charged. At time t42, the controller 13 sets the second enable signal to the high level. At this time, the first PWM signal and the first enable signal maintain the high level. As a result, while the first switch element 31 maintains the activation state, the first switch element 32 is activated. Thus, the boot capacitor 72B of the bootstrap circuit 70B is charged.

At time t43, the controller 13 sets each of the second PWM signal and the third enable signal to the high level. At this time, the first PWM signal, the first enable signal, and the second enable signal maintain the high level. As a result, while the first switches 31 and 32 maintain the activation state, the second switch element 41 is activated. Thus, the boot capacitor 72B charges the boot capacitor 72C of the bootstrap circuit 70C. At time t44, the controller 13 sets the fourth enable signal to the high level. At this time, the first PWM signal, the second PWM signal, and the first to third enable signals maintain the high level. As a result, while the first switches 31 and 32 and the second switch element 41 maintain the activation state, the second switch element 42 is activated. Thus, the boot capacitor 72B charges the boot capacitor 72D of the bootstrap circuit 70D. At time t45, the controller 13 sets the first PWM signal, the second PWM signal, and the first to fourth enable signals to the low level. As described above, until the charging is completed, the controller 13 maintains the first to fourth enable signals at the high level and then, at time t45, sets all of the first to fourth enable signals to the low level.

At time t45, the controller 13 sets the third PWM signal and the fifth enable signal to the high level. As a result, the third switch element 51 is activated, so that the boot capacitor 72D charges the boot capacitor 72E of the bootstrap circuit 70E. At time t46, the controller 13 sets the sixth enable signal to the high level. At this time, the third PWM signal and the fifth enable signal maintain the high level. As a result, while the third switch element 51 maintains the activation state, the third switch element 52 is activated. Thus, the boot capacitor 72D charges the boot capacitor 72F of the bootstrap circuit 70F.

At time t47, the controller 13 sets the fourth PWM signal and the seventh enable signal to the high level. At this time, the third PWM signal, the fifth enable signal, and the sixth enable signal maintain the high level. As a result, while the third switches 51 and 52 maintain the activation state, the fourth switch element 61 is activated. Thus, the boot capacitor 72F charges the boot capacitor 72G of the bootstrap circuit 70G. At time t48, the controller 13 sets the third PWM signal, the fourth PWM signal, and the fifth to seventh enable signals to the low level. As described above, until the charging is completed, the controller 13 maintains the fifth to seventh enable signals at the high level and then, at time t48, sets all of the fifth to seventh enable signals to the low level.

After time t49, the controller 13 executes the first operation. At time t49, the controller 13 sets the first to eighth enable signals to the high level. The controller 13 maintains the first to eighth enable signals at the high level during the first operation.

At time t49, the controller 13 sets the second PWM signal and the fourth PWM signal to the high level. As a result, the second switches 41 and 42 and the fourth switches 61 and 62 are activated. In this case, the operation is in the second mode from time t49 to time t50. At time t50, the controller 13 sets the first PWM signal to the high level and the fourth PWM signal to the low level. At this time, the second PWM signal maintains the high level. As a result, as the first switches 31 and 32 are activated, the switches 61 and 62 of the fourth switch group 60 are deactivated. The second switches 41 and 42 remain activated. That is, from time t50 to time t51, the operation is in the fourth mode.

At time t51, the controller 13 sets the second PWM signal to the low level and the third PWM signal to the high level. As a result, as the second switches 41 and 42 are deactivated, the third switches 51 and 52 are activated. The first switches 31 and remain activated. That is, from time t51 to time t52, the operation is in the first mode.

At time t52, the controller 13 sets the second PWM signal to the high level and the third PWM signal to the low level. At this time, the first PWM signal maintains the high level. As a result, as the second switches 41 and 42 are activated, the third switches 51 and 52 are deactivated. The first switches 31 and 32 remain activated. At time t53, the controller 13 sets the first PWM signal to the low level and the fourth PWM signal to the high level. That is, from time t52 to t53, the operation is in the fourth mode. At time t53, the operation is changed to the second mode. As described above, the first operation of the present preferred embodiment repeatedly changes in the order of the second mode, the fourth mode, the first mode, and the fourth mode.

The present preferred embodiment has the following advantages.

(3-1) The controller 13 includes the first signal generation circuit 81 configured to generate a PWM signal, the second signal generation circuit 82 configured to generate an enable signal, and the logic circuit 13b. The logic circuit 13b includes the AND circuits 111 to 118 corresponding to the drive circuits 25A to 25H. When the first to eighth enable signals are at the high level, the logic circuit 13b outputs the PWM signal. With this configuration, the integrated circuit 120 may include a fewer number of terminals for a PWM signal as compared to a configuration in which a PWM signal is input to each of the drive circuits 25A to 25H. In addition, since the first signal generation circuit 81 is configured to generate the first to fourth PWM signals, the configuration of the first signal generation circuit 81 is simplified as compared to a first signal generation circuit that is configured to generate PWM signals corresponding to the number of drive circuits. Further, the integrated circuit 90 may include a fewer number of terminals for a PWM signal. Accordingly, the cost of the switching circuit 20A is reduced.

Fourth Preferred Embodiment

A switching circuit 20A according to a fourth preferred embodiment of the present invention will now be described with reference to FIGS. 18 and 19. The switching circuit 20A of the present preferred embodiment differs from the switching circuit 20A of the third preferred embodiment in that the bootstrap circuit 70D is omitted and a power supply 26H is included. In the description below, the same reference characters denote components that are the same or substantially the same as the corresponding components of the third preferred embodiment. Such components will not be described in detail.

Figure 18:
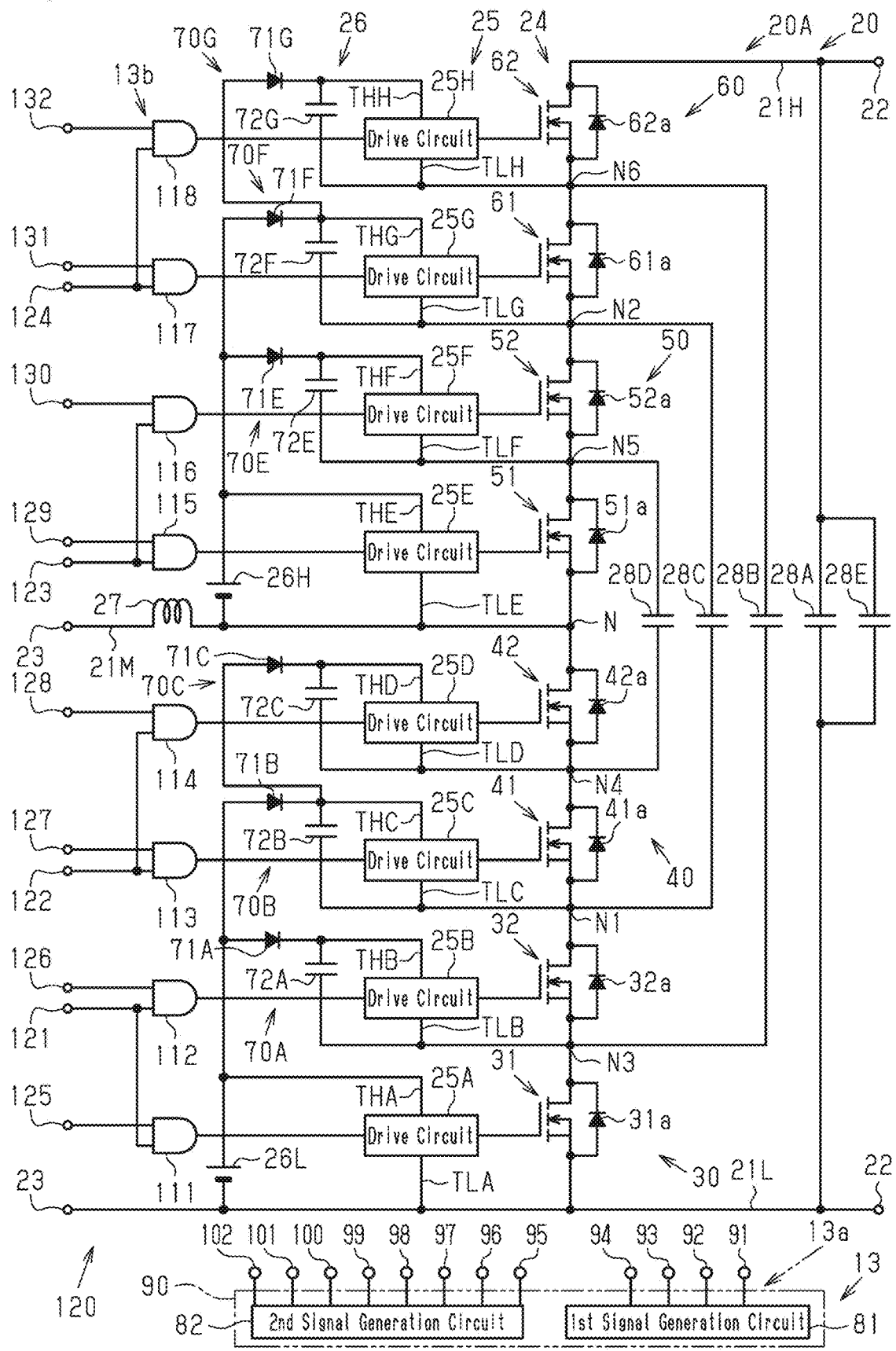
FIG. 18 is a circuit diagram showing a switching circuit according to a fourth preferred embodiment of the present invention.
Figure 19:
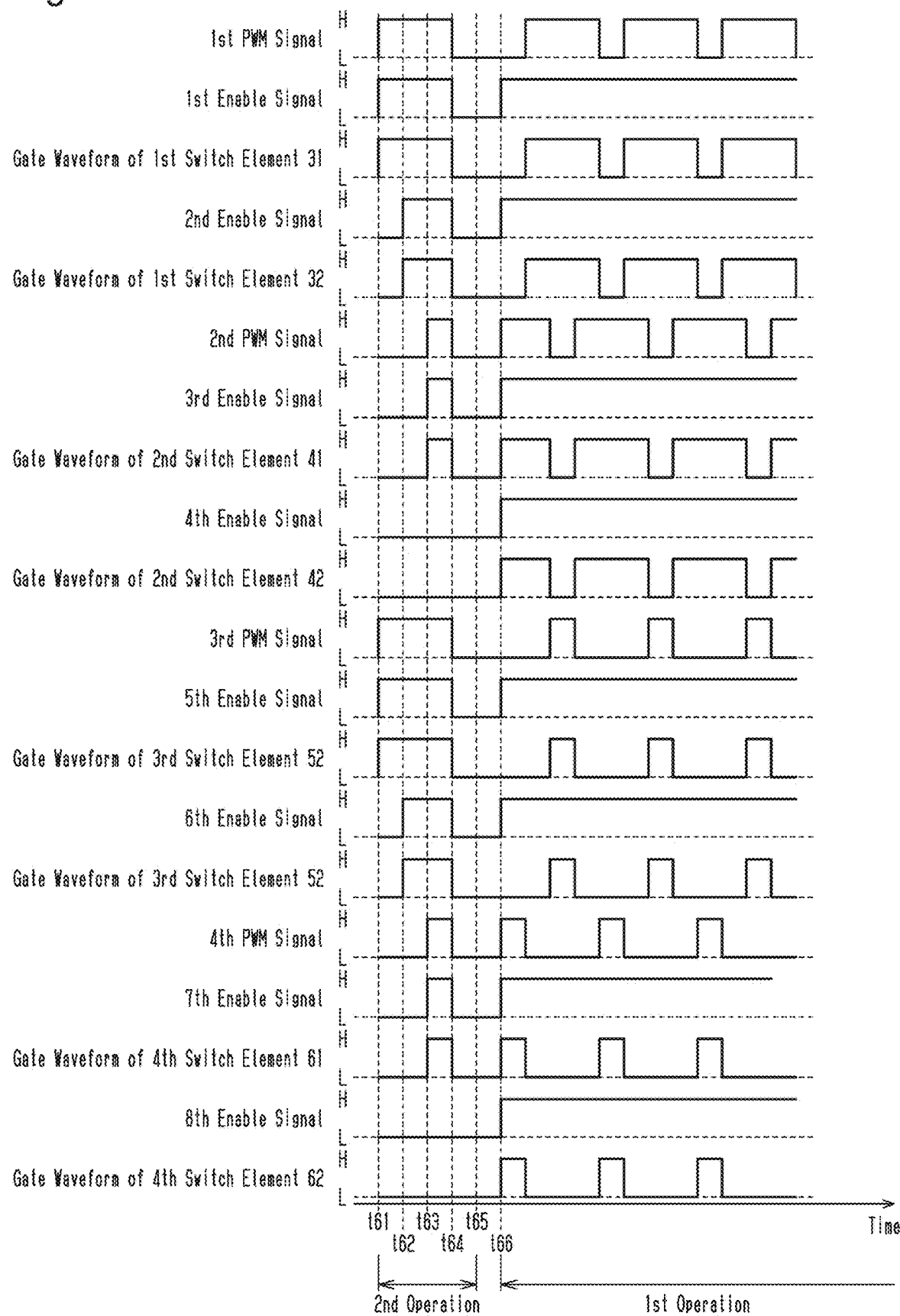
FIG. 19 is a time chart showing an example of an operation of the switching circuit according to the fourth preferred embodiment of the present invention.

As shown in FIG. 18, in the present preferred embodiment, the power supply circuit 26 includes the power supply 26L and the power supply 26H. The power supply 26L supplies power to the drive circuit 25A, which is located at the low potential side. The power supply 26H supplies power to the drive circuit 25E, which is located at the high potential side. The power supply 26L corresponds to a first power supply. The power supply 26H corresponds to a second power supply. The drive circuits 25A to 25D correspond to a first drive circuit. The drive circuits 25E to 25H correspond to a second drive circuit.

The power supply 26H is preferably, for example, a direct current power supply. The power supply 26H is connected to the drive circuit 25E, which is located closest to the third wire 21M among the drive circuits 25E to 25H. More specifically, a negative terminal of the power supply 26H is connected to the connection node N, and a positive terminal of the power supply 26H is connected to the high-potential power supply terminal THE of the drive circuit 25E.

In the present preferred embodiment, among the boot capacitors 72A to 72C of the bootstrap circuits 70A to 70C, the boot capacitor 72B has a larger electrostatic capacitance than the remaining boot capacitors 72A and 72C. Among the boot capacitors 72E to 72G of the bootstrap circuits 70E to 70G, the boot capacitor 72F has a larger electrostatic capacitance than the remaining boot capacitors 72E and 72G. Therefore, the boot capacitor 72B charges the boot capacitor 72C, and the boot capacitor 72F charges the boot capacitor 72G.

The second operation of the present preferred embodiment differs from the second operation of the third preferred embodiment. The second operation of the present preferred embodiment sequentially activates the first switch element 31, the first switch element 32, the second switch element 41, and the second switch element 42, and sequentially activates the third switch element 51, the third switch element 52, and the fourth switch element 61.

An execution mode of the power conversion device 20 driven by the controller 13 will now be described with reference to FIG. 19.

The controller 13 executes the second operation from time t61 to time t65 and then executes the first operation after time t66. The first operation is the same or substantially the same as that of the third preferred embodiment and thus will not be described in detail.

At time t61, the controller 13 sets the first PWM signal, the first enable signal, the third PWM signal, and the fifth enable signal to the high level. As a result, the first switch element 31 and the third switch element 51 are activated. Thus, the power supply 26L charges the boot capacitor 72A of the bootstrap circuit 70A, and the power supply 26H charges the boot capacitor 72E of the bootstrap circuit 70E.

At time t62, the controller 13 sets the second enable signal and the sixth enable signal to the high level. At this time, the first PWM signal, the first enable signal, the third PWM signal, and the fifth enable signal maintain the high level. As a result, the first switch element 32 and the third switch element 52 are activated, and the first switch element 31 and the third switch element 51 maintain the activation state. Thus, the power supply 26L charges the boot capacitor 72B of the bootstrap circuit 70B, and the power supply 26H charges the boot capacitor 72F of the bootstrap circuit 70F. As described above, until the charging is completed, the controller 13 maintains the first to third enable signals and the fifth to seventh enable signals at the high level and then, at time t64, sets all of the first to third enable signals and the fifth to seventh enable signals to the low level.

At time t63, the controller 13 sets the second PWM signal, the third enable signal, the fourth PWM signal, and the seventh enable signal to the high level. At this time, the first PWM signal, the third PWM signal, the first enable signal, the second enable signal, the fifth enable signal, and the sixth enable signal maintain the high level. As a result, the second switch element 41 and the fourth switch element 61 are activated, and the first switches 31 and 32 and the third switches 51 and 52 remain activated. Thus, the boot capacitor 72B charges the boot capacitor 72C of the bootstrap circuit 70C, and the boot capacitor 72F charges the boot capacitor 72G of the bootstrap circuit 70G. At time t64, the controller 13 sets the first to fourth PWM signals, the first to third enable signals, and the fifth to seventh enable signals to the low level. As a result, the first switches 31 and 32, the second switch element 41, the third switches 51 and 52, and the fourth switch element 61 are deactivated.

Other Preferred Embodiments

The above-described preferred embodiments may be modified as follows. The preferred embodiments and the following modified examples can be combined as long as the combined modified examples are technically consistent with each other.

In the first preferred embodiment, the second operation shown in FIG. 9 or 10 may be executed. In each example, the boot capacitors 72A to 72G of the bootstrap circuits 70A to 70G are charged by activating in order starting from the switch element 31, which is located at the lowest potential side in the first switch group 30, while maintaining the deactivation state of the switch element 62, which is the highest potential one of the switches 61 and 62 in the fourth switch group 60.

As shown in FIG. 9, in the same or similar manner as the first preferred embodiment, the controller 13 activates the first switch element 31 at time t11, the first switch element 32 at time t12, the second switch element 41 at time t13, and the second switch element 42 at time t14. At time t15, the controller 13 deactivates the first switches 31 and 32 and the second switches 41 and 42. In the same or similar manner as the first preferred embodiment, the controller 13 activates the third switch element 51 at time t15, the third switch element 52 at time t16, and the fourth switch element 61 at time t17. At time t18, the controller 13 deactivates the third switches 51 and 52 and the fourth switch element 61. That is, in the example of the second operation shown in FIG. 9, the switches in the first switch group 30 and the second switch group 40 are simultaneously deactivated, and the switches in the third switch group 50 and the fourth switch group 60 are simultaneously deactivated.

As shown in FIG. 10, in the same or similar manner as the first preferred embodiment, the controller 13 activates the first switch element 31 at time t11, the first switch element 32 at time t12, the second switch element 41 at time t13, and the second switch element 42 at time t14. The controller 13 activates the third switch element 51 at time t15, the third switch element 52 at time t16, and the fourth switch element 61 at time t17. At time t18, the controller 13 deactivates the first switches 31 and 32, the second switches 41 and 42, the third switches 51 and 52, and the fourth switch element 61. That is, in the example of the second operation shown in FIG. 10, the switches of the first to fourth switch groups 30, 40, 50, and 60 are simultaneously deactivated.

Figure 13:
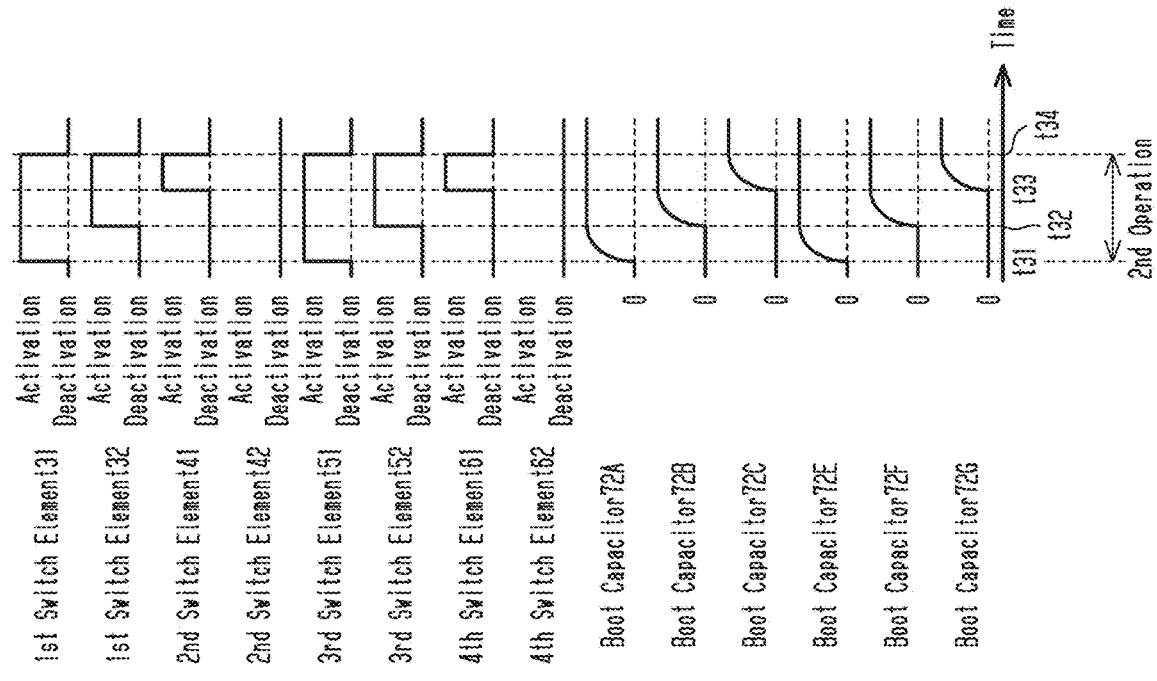
FIG. 13 is a time chart showing an example of an operation of a switching circuit in a modified example of a preferred embodiment of the present invention.
Figure 14:
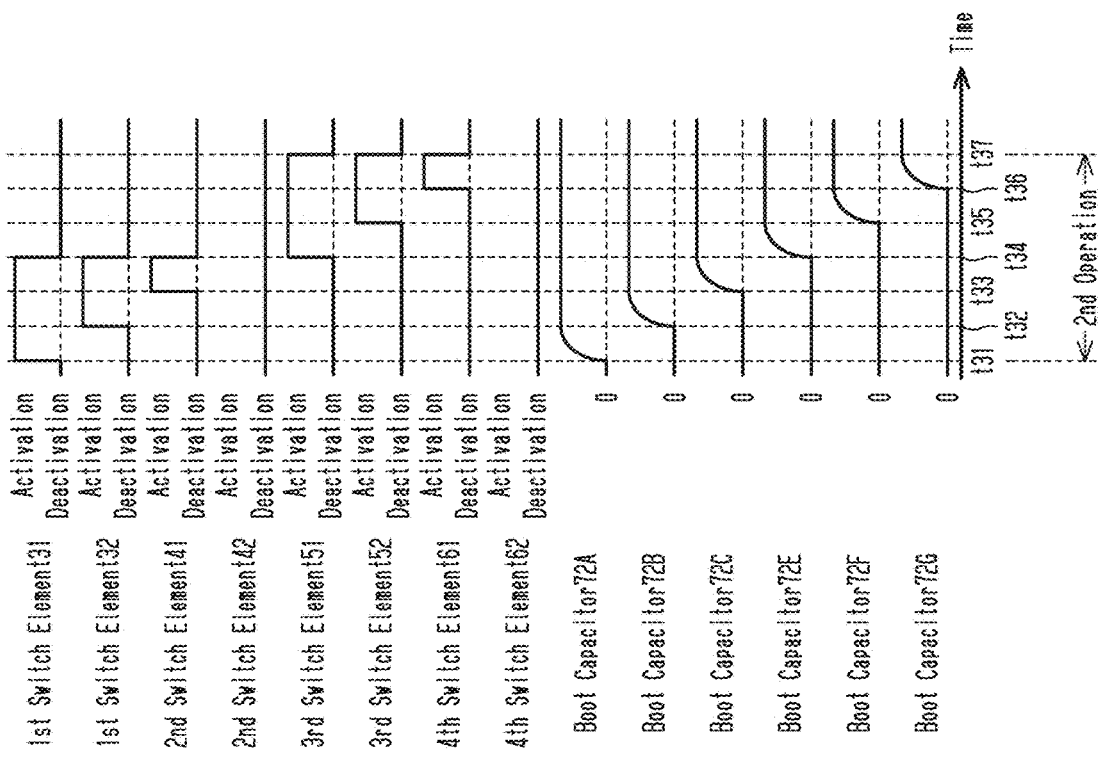
FIG. 14 is a time chart showing an example of an operation of a switching circuit in a modified example of a preferred embodiment of the present invention.
Figure 15:
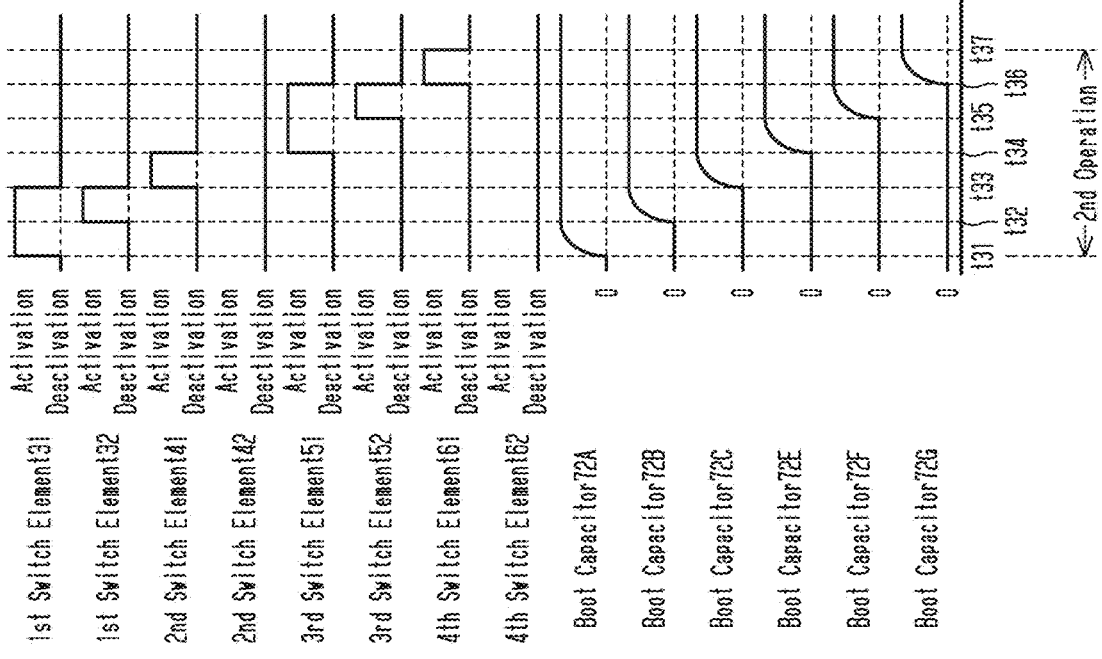
FIG. 15 is a time chart showing an example of an operation of a switching circuit in a modified example of a preferred embodiment of the present invention.

In the second preferred embodiment, the second operation shown in FIG. 13, 14, or 15 may be executed. In each example, the boot capacitors 72A to 72C of the bootstrap circuits 70A to 70C are charged by activating in order starting from the switch element 31, which is located at the lowest potential side in the first switch group 30, and the boot capacitors 72E to 72G of the bootstrap circuits 70E to 70G are charged by activating in order starting from the switch element 51, which is located at the lowest potential side in the third switch group 50. At this time, the switch element 42, which is located at the highest potential side in the second switch group 40, and the switch element 62, which is located at the highest potential side in the fourth switch group 60, are deactivated.

As shown in FIG. 13, in the same or similar manner as the second preferred embodiment, the controller 13 activates the first switch element 31 and the third switch element 51 at time t31, the first switch element 32 and the third switch element 52 at time t32, and the second switch element 41 and the fourth switch element 61 at time t33. At time t34, the controller 13 deactivates the first switches 31 and 32, the second switch element 41, the third switches 51 and 52, and the fourth switch element 61. That is, in the example of the second operation shown in FIG. 13, the switches of the first to fourth switch groups 30, 40, 50, and 60 are simultaneously deactivated.

In the second preferred embodiment and the modified example shown in FIG. 13, in the second operation, the first switch element 31 and the third switch element 51 are simultaneously activated, the first switch element 32 and the third switch element 52 are simultaneously activated, and the second switch element 41 and the fourth switch element 61 are simultaneously activated. However, there is no limitation to such a configuration. After the first switches 31 and 32 and the second switch element 41 are sequentially activated, the third switches 51 and 52 and the fourth switch element 61 may be sequentially activated.

As shown in FIG. 14, at time t31, the controller 13 activates only the first switch element 31 to charge the boot capacitor 72A. At time t32, the controller 13 activates the first switch element 32 to charge the boot capacitor 72B. At time t33, the controller 13 deactivates the first switches 31 and 32 and activates the second switch element 41 to charge the boot capacitor 72C. After time t33, at time t34, the controller 13 deactivates the second switch element 41 and activates the third switch element 51 to charge the boot capacitor 72E. After time t34, at time t35, the controller 13 activates the third switch element 52 to charge the boot capacitor 72F. After time t35, at time t36, the controller 13 deactivates the third switches 51 and 52 and activates the fourth switch element 61 to charge the boot capacitor 72G. After time t36, at time t37, the controller 13 deactivates the fourth switch element 61.

As shown in FIG. 15, at time t31, the controller 13 activates only the first switch element 31 to charge the boot capacitor 72A. At time t32, the controller 13 activates the first switch element 32 to charge the boot capacitor 72B. The controller activates the second switch element 41 to charge the boot capacitor 72C. After time t33, at time t34, the controller 13 deactivates the first switches 31 and 32 and the second switch element 41 and activates the third switch element 51 to charge the boot capacitor 72E. After time t34, at time t35, the controller activates the third switch element 52 to charge the boot capacitor 72F. After time t35, at time t36, the controller 13 activates the fourth switch element 61 to charge the boot capacitor 72G. After time t36, at time t37, the controller 13 deactivates the third switches 51 and 52 and the fourth switch element 61.

Figure 20:
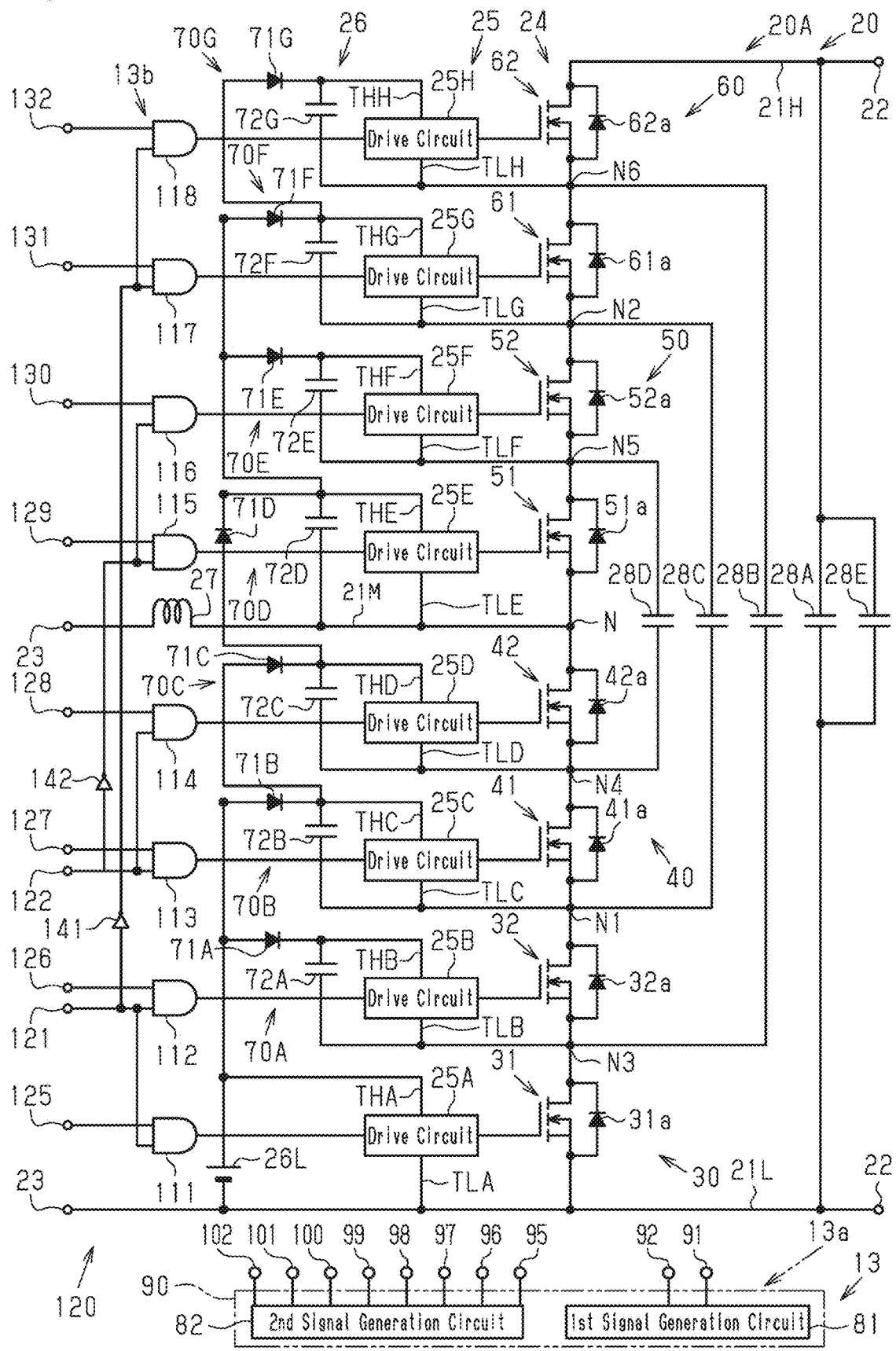
FIG. 20 is a circuit diagram showing a modified example of a switching circuit according to a preferred embodiment of the present invention.

In the third preferred embodiment, the configuration of the controller 13 may be changed in any manner. In an example, as shown in FIG. 20, the first signal generation circuit 81 of the controller 13 outputs the first PWM signal and the second PWM signal. The logic circuit 13b of the controller 13 controls activation and deactivation of the first switch group 30 and the fourth switch group 60 based on the first PWM signal and activation and deactivation of the second switch group 40 and the third switch group 50 based on the second PWM signal. More specifically, the controller 13 includes a first NOT circuit 141 that is electrically connected to the terminal 121 and a second NOT circuit 142 that is electrically connected to the terminal 122. The first NOT circuit 141 is between the AND circuit 112 and the AND circuit 117. The second NOT circuit 142 is between the AND circuit 113 and the AND circuit 115. The first PWM signal is input to the first input terminals of the AND circuits 111 and 112. The first PWM signal is also input to the first input terminals of the AND circuits 117 and 118 through the first NOT circuit 141. Thus, the first input terminals of the AND circuits 117 and 118 receive an inverted signal of the first PWM signal. The second PWM signal is input to the first input terminals of the AND circuits 113 and 114. The second PWM signal is also input to the first input terminals of the AND circuits 115 and 116 through the second NOT circuit 142. Thus, the first input terminals of the AND circuits 115 and 116 receive an inverted signal of the second PWM signal. With this configuration, the third PWM signal and the fourth PWM signal are omitted. Accordingly, the terminals for the third PWM signal, that is, the terminal 93 of the integrated circuit 90 and the terminal 123 of the integrated circuit 120, and the terminals for the fourth PWM signal, that is, the terminal 94 of the integrated circuit 90 and the terminal 124 of the integrated circuit 120, are omitted. This simplifies the configuration of the controller 13 and reduces the cost of the power conversion device 20. The configuration of the controller 13 of the fourth preferred embodiment may be changed to the configuration of the controller 13 shown in FIG. 20.

In the third preferred embodiment, the fourth preferred embodiment, and the modified examples, when each enable signal is at the high level, the controller 13 outputs a PWM signal to the drive circuits 25A to 25H. However, there is no limitation to such a configuration. For example, when each enable signal is at the low level, the controller 13 may output a PWM signal to the drive circuits 25A to 25H. That is, the controller 13 may have any configuration that outputs a PWM signal when each enable signal is at a predetermined level. The predetermined level may be set to the high level or the low level as necessary.

In each of the preferred embodiments, each of the switches 31, 32, 41, 42, 51, 52, 61, and 62 may preferably be an insulated gate bipolar transistor (IGBT) element, for example. In this case, a flyback diode is connected in parallel to the IGBT element. Each of the switches 31, 32, 41, 42, 51, 52, 61, and 62 may preferably be, for example, a transistor other than an IGBT element and a MOSFET, such as a bipolar transistor, for example.

In each of the preferred embodiments, each of the first to fourth switch groups 30, 40, 50, and 60 includes two switches. Instead, each of the first to fourth switch groups 30, 40, 50, and 60 may include three or more switches. In this case, it is preferable that the switch groups 30, 40, 50, and 60 have the same number of switches.

In each of the preferred embodiments, the switching circuit 20A is used in the power conversion device 20 of the power managing system 1 that is a single-phase two-wire system. Instead, the switching circuit 20A may be used in the power conversion device 20 of a single-phase three-wire power managing system 1, for example.

In each of the preferred embodiments, the switching circuit 20A is used in a bidirectional power conversion device. Instead, the switching circuit 20A may be used in a unidirectional power conversion device, for example.

In each of the preferred embodiments, the number of the switches 31, 32, 41, 42, 51, 52, 61, and 62 in each of the first to fourth switch groups 30, 40, 50, and 60 is n, that is, the same number. However, even when the number of switches differs between the first to fourth switch groups, a three-level converter obtaining the same or substantially the same advantages is obtained.

In this specification, "first," "second," and other numerical terms do not indicate sequence or order unless explicitly indicated by the context. For example, a fourth element may be referred to as a second element without departing from the scope of the exemplary preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A three-level converter, comprising:
   first input/output portions to which a first voltage is applied;
   second input/output portions to which a second voltage that is lower than the first voltage is applied;
   a switch circuit including first to fourth switch groups, each of which includes n switches connected in series, where n is an integer that is greater than or equal to two, the first switch group, the second switch group, the third switch group, and the fourth switch group being connected in series between the first input/output portions sequentially from a low potential side of the first input/output portions;
   an inductor connected to a high potential side of the second input/output portions and connected in series with the first switch group and the second switch group between the second input/output portions;
   a controller to output a control signal to control the switches;
   a flying capacitor connected between a first connection point and a second connection point, the first connection point being located between the first switch group and the second switch group, and the second connection point being located between the third switch group and the fourth switch group;
   drive circuits respectively to activate and deactivate the switches in the first to fourth switch groups based on the control signal;
   a power supply connected to one of the drive circuits, to activate and deactivate one of the switches located at a side of the first input/output portions in the first switch group, the power supply to supply a voltage to the one of the drive circuits connected to the power supply; and
   bootstrap circuits respectively connected to the drive circuits excluding the one of the drive circuits connected to the power supply, each of the bootstrap circuits to supply a voltage to the connected one of the drive circuits based on a voltage of the power supply;
   wherein
   a cathode of a boot diode in one of the bootstrap circuits that is connected to one of the drive circuits, to drive one of the switches located at a lowest potential side in the second switch group, is connected to an anode of a boot diode in another one of the bootstrap circuits in the second switch group;
   a cathode of a boot diode in one of the bootstrap circuits that is connected to one of the drive circuits, to drive one of the switches located at a lowest potential side in the third switch group, is connected to an anode of a boot diode in another one of the bootstrap circuits in the third switch group;

a cathode of a boot diode in one of the bootstrap circuits that is connected to one of the drive circuits, to drive one of the switches located at a lowest potential side in the fourth switch group, is connected to an anode of a boot diode in another one of the bootstrap circuits in the fourth switch group; and the controller is configured or programmed to execute a first operation that complementarily drives the switches in the first switch group and the switches in the fourth switch group and complementarily drives the switches in the second switch group and the switches in the third switch group.

2. The three-level converter according to claim 1, wherein a boot capacitor in one of the bootstrap circuits connected to one of the drive circuits, to drive the one of the switches located at the lowest potential side in the second switch group, a boot capacitor in one of the bootstrap circuits connected to one of the drive circuits, to drive the one of the switches located at the lowest potential side in the third switch group, and a boot capacitor in one of the bootstrap circuits connected to one of the drive circuits, to drive the one of the switches located at the lowest potential side in the fourth switch group, have a larger capacitance than a boot capacitor in another one of the bootstrap circuits;

when the boot capacitor in the one of the bootstrap circuits connected to the one of the drive circuits, to drive the one of the switches located at the lowest potential side in the second switch group, has a capacitance A1, the boot capacitor in the one of the bootstrap circuits connected to the one of the drive circuits, to drive the one of the switches located at the lowest potential side in the third switch group, has a capacitance A2, and the boot capacitor in the one of the bootstrap circuits connected to the one of the drive circuits, to drive the one of the switches located at the lowest potential side in the fourth switch group, has a capacitance A3, a relationship of A1>A2>A3 is satisfied.

3. The three-level converter according to claim 1, wherein the controller is configured or programmed to executes a second operation that charges the boot capacitors of the bootstrap circuits prior to the first operation; and in the second operation, the drive circuits activate in order starting from the one of the switches located at a lowest potential side in the first switch group while maintaining a deactivation state of one of the switches located at a highest potential side in the fourth switch group to charge the boot capacitors of the bootstrap circuits.

4. The three-level converter according to claim 1, wherein the controller includes:

a first signal generation circuit to generate a PWM signal that drives the first to fourth switch groups;

a second signal generation circuit to generate an enable signal that instructs to validate or invalidate an output of the PWM signal to the drive circuits; and a logic circuit connected to the first signal generation circuit and the second signal generation circuit; wherein when the enable signal is at a predetermined level and the PWM signal is input, the logic circuit outputs the PWM signal to the drive circuits.

5. The three-level converter according to claim 4, wherein the first signal generation circuit is to generate the PWM signal for each of the first to fourth switch groups.

6. The three-level converter according to claim 5, wherein the logic circuit includes a first NOT circuit and a second NOT circuit;

the PWM signal includes a first PWM signal and a second PWM signal;

the first signal generation circuit inputs a signal inverted from the first PWM signal through the first NOT circuit to one of the first switch group and the fourth switch group and inputs the first PWM signal to another one of the first switch group and the fourth switch group; and the first signal generation circuit inputs a signal inverted from the second PWM signal through the second NOT circuit to one of the second switch group and the third switch group and inputs the second PWM signal to another one of the second switch group and the third switch group.

7. The three-level converter according to claim 1, wherein the controller includes a central processing unit or a micro processing unit.

8. The three-level converter according to claim 1, wherein the controller includes at least one of nonvolatile memory or volatile memory.

9. The three-level converter according to claim 1, wherein the switches are MOSFETs including a silicon substrate.

10. The three-level converter according to claim 9, wherein each of the MOSFETs is an N-type MOSFET.

11. A three-level converter, comprising:

first input/output portions to which a first voltage is applied;

second input/output portions to which a second voltage that is lower than the first voltage is applied;

a switch circuit unit including first to fourth switch groups, each of which includes n switches connected in series, wherein n is an integer that is greater than or equal to two, the first switch group, the second switch group, the third switch group, and the fourth switch group being connected in series between the first input/output portions sequentially from a low potential side of the first input/output portions;

an inductor connected to a high potential side of the second input/output portions and connected in series with the first switch group and the second switch group between the second input/output portions;

a controller configured or programmed to output a control signal that controls the switches;

a flying capacitor connected between a first connection point and a second connection point, the first connection point being located between the first switch group and the second switch group, and the second connection point being located between the third switch group and the fourth switch group;

first drive circuits to activate and deactivate the switches in the first switch group and the second switch group based on the control signal;

second drive circuits to activate and deactivate the switches in the third switch group and the fourth switch group based on the control signal;

a first power supply connected to one of the first drive circuits, to activate and deactivate one of the switches located at a side of the first input/output portions in the first switch group, the first power supply being to supply a voltage to the one of the first drive circuits connected to the first power supply;

first bootstrap circuits respectively connected to the first drive circuits excluding the one of the first drive circuits connected to the first power supply, each of the first bootstrap circuits being to supply a voltage to the connected one of the first drive circuits based on a voltage of the first power supply;

a second power supply connected to one of the second drive circuits, to activate and deactivate one of the switches located at a side of the first input/output portions in the third switch group, the second power supply being to supply a voltage to the one of the second drive circuits connected to the second power supply; and second bootstrap circuits respectively connected to the second drive circuits excluding the one of the second drive circuits connected to the second power supply, each of the second bootstrap circuits being to supply a voltage to the connected one of the second drive circuits based on a voltage of the second power supply; wherein a cathode of a boot diode in one of the first bootstrap circuits, to drive one of the switches located at a lowest potential side in the second switch group, is connected to an anode of a boot diode in another one of the first bootstrap circuits in the second switch group;

a cathode of a boot diode in one of the second bootstrap circuits, to drive one of the switches located at a lowest potential side in the fourth switch group, is connected to an anode of a boot diode in another one of the second bootstrap circuits in the fourth switch group; and the controller is configured or programmed to execute a first operation that complementarily drives the switches in the first switch group and the switches in the fourth switch group and complementarily drives the switches in the second switch group and the switches in the third switch group.

12. The three-level converter according to claim 11, wherein
a boot capacitor in one of the first bootstrap circuits that is connected to one of the first drive circuits, to drive the one of the switches located at the lowest potential side in the second switch group, has a larger capacitance than a boot capacitor in another one of the first bootstrap circuits connected to the first drive circuits; and a boot capacitor in one of the second bootstrap circuits that is connected to one of the second drive circuits, to drive the one of the switches located at the lowest potential side in the fourth switch group, has a larger capacitance than a boot capacitor in another one of the second bootstrap circuits connected to the second drive circuits.

13. The three-level converter according to claim 11, wherein
the controller is configured or programmed to execute a second operation that charges boot capacitors in the first bootstrap circuits and boot capacitors in the second bootstrap circuits prior to the first operation;

in the second operation, the first drive circuits activate in order starting from the one of the switches located at the lowest potential side in the first switch group while maintaining a deactivation state of one of the switches located at a highest potential side in the second switch group, to charge the boot capacitors of the first bootstrap circuits; and in the second operation, the second drive circuits activate in order starting from the one of the switches located at the lowest potential side in the third switch group while maintaining a deactivation state of one of the switches located at a highest potential side in the fourth switch group, to charge the boot capacitors of the second bootstrap circuits.

14. The three-level converter according to claim 11, wherein the controller includes:
a first signal generation circuit to generate a PWM signal that drives the first to fourth switch groups;
a second signal generation circuit to generate an enable signal that instructs to validate or invalidate an output of the PWM signal to the first drive circuits and the second drive circuits; and
a logic circuit connected to the first signal generation circuit and the second signal generation circuit; wherein
when the enable signal is at a predetermined level and the PWM signal is input, the logic circuit outputs the PWM signal to the first drive circuits and the second drive circuits.

15. The three-level converter according to claim 14, wherein the first signal generation circuit is to generate the PWM signal for each of the first to fourth switch groups.

16. The three-level converter according to claim 15, wherein
the logic circuit includes a first NOT circuit and a second NOT circuit;
the PWM signal includes a first PWM signal and a second PWM signal;
the first signal generation circuit inputs a signal inverted from the first PWM signal through the first NOT circuit to one of the first switch group and the fourth switch group and inputs the first PWM signal to another one of the first switch group and the fourth switch group; and
the first signal generation circuit inputs a signal inverted from the second PWM signal through the second NOT circuit to one of the second switch group and the third switch group and inputs the second PWM signal to another one of the second switch group and the third switch group.

17. The three-level converter according to claim 11, wherein the controller includes a central processing unit or a micro processing unit.

18. The three-level converter according to claim 11, wherein the controller includes at least one of nonvolatile memory or volatile memory.

19. The three-level converter according to claim 11, wherein the switches are MOSFETs including a silicon substrate.

20. The three-level converter according to claim 19, wherein each of the MOSFETs is an N-type MOSFET.

* * * * *